(12) United States Patent
Hayashiguchi

(10) Patent No.: US 12,538,854 B2
(45) Date of Patent: Jan. 27, 2026

(54) SEMICONDUCTOR APPARATUS

(71) Applicant: ROHM CO., LTD., Kyoto (JP)

(72) Inventor: Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 466 days.

(21) Appl. No.: 18/248,194

(22) PCT Filed: Dec. 16, 2021

(86) PCT No.: PCT/JP2021/046445
§ 371 (c)(1),
(2) Date: Apr. 6, 2023

(87) PCT Pub. No.: WO2022/145250
PCT Pub. Date: Jul. 7, 2022

(65) Prior Publication Data
US 2023/0378038 A1    Nov. 23, 2023

(30) Foreign Application Priority Data

Jan. 4, 2021 (JP) .................................. 2021-000238

(51) Int. Cl.
*H01L 23/00* (2006.01)
*H01L 23/498* (2006.01)
*H01L 25/07* (2006.01)

(52) U.S. Cl.
CPC ........ *H01L 23/49811* (2013.01); *H01L 24/48* (2013.01); *H01L 24/49* (2013.01);
(Continued)

(58) Field of Classification Search
CPC ... H01L 23/49811; H01L 24/48; H01L 24/49; H01L 25/072; H01L 24/32; H01L 24/73;
(Continued)

(56) References Cited

FOREIGN PATENT DOCUMENTS

| JP | 10-247704 | 9/1998 |
|---|---|---|
| JP | 2001-185679 | 7/2001 |

(Continued)

OTHER PUBLICATIONS

International Search Report issued in International Application No. PCT/2021/046445, Mar. 15, 2022, 5 pages w/ translation.
(Continued)

*Primary Examiner* — Elias Ullah
(74) *Attorney, Agent, or Firm* — HSML P.C.

(57) ABSTRACT

A semiconductor device includes a plurality of semiconductor elements, each of which has a first electrode, a second electrode, and a third electrode, and is subjected to an ON-OFF control between the first electrode and the second electrode in accordance with a driving signal input to the third electrode. Further, the semiconductor device includes a control terminal to which the driving signal is input, a first wiring portion to which the control terminal is connected, a second wiring portion separated from the first wiring portion, a first connection member to conduct the first wiring portion and the second wiring portion, and a second connection member to conduct the second wiring portion and the third electrode of one of the plurality of semiconductor elements. The respective first electrodes of the plurality of semiconductor elements are electrically connected to one another, and respective second electrodes of the plurality of semiconductor elements are electrically connected to one another.

20 Claims, 23 Drawing Sheets

(52) U.S. Cl.
CPC ............ *H01L 25/072* (2013.01); *H01L 24/32* (2013.01); *H01L 24/73* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/49111* (2013.01); *H01L 2224/49112* (2013.01); *H01L 2224/49175* (2013.01); *H01L 2224/73265* (2013.01); *H01L 2924/10253* (2013.01); *H01L 2924/10272* (2013.01); *H01L 2924/10329* (2013.01); *H01L 2924/1033* (2013.01); *H01L 2924/1067* (2013.01); *H01L 2924/13055* (2013.01); *H01L 2924/13091* (2013.01)

(58) Field of Classification Search
CPC . H01L 2224/32225; H01L 2224/45124; H01L 2224/45144; H01L 2224/45147; H01L 2224/48091; H01L 2224/48227; H01L 2224/49111; H01L 2224/49112; H01L 2224/49175; H01L 2224/73265; H01L 2924/10253; H01L 2924/10272; H01L 2924/10329; H01L 2924/1033; H01L 2924/1067; H01L 2924/13055; H01L 2924/13091; H01L 23/3107; H01L 23/4334; H01L 23/13; H01L 23/3735; H01L 23/492; H01L 23/5386; H01L 24/41; H01L 2224/0603; H01L 2224/06181; H01L 2224/48137; H01L 2224/4903; H01L 2224/92247; H01L 2924/19107

See application file for complete search history.

(56) References Cited

FOREIGN PATENT DOCUMENTS

| | | |
|---|---|---|
| JP | 2016-162773 A | 9/2016 |
| JP | 2016-225493 | 12/2016 |
| JP | 2019-220719 | 12/2019 |

OTHER PUBLICATIONS

Office Action issued in corresponding Japanese Patent application No. 2022-572993, Sep. 9, 2025, and machine translation (16 pages).

SEMICONDUCTOR APPARATUS

TECHNICAL FIELD

The present disclosure relates to a semiconductor device.

BACKGROUND ART

Conventionally, a semiconductor device provided with a semiconductor element for power such as MOSFET (Metal Oxide Semiconductor Field Effect Transistor and IGBT (Insulated Gate Bipolar Transistor) has been known. As to such a semiconductor device, a configuration to parallelly connect a plurality of semiconductor elements for power to secure the tolerable current for the semiconductor device has been known (e.g., Patent Literature 1). The power module disclosed by Patent Literature 1 is provided with a plurality of semiconductor elements, a plurality of connection wires, wiring layers, and signal terminals. Each semiconductor element is, for example, a MOSFET, and executes ON-OFF driving operation in accordance with a driving signal input to the gate terminal. A plurality of connection wires connect a gate terminal of each of the plurality of semiconductor elements to a wiring layer. The wiring layer is connected to a signal terminal. According to a configuration like this, the signal terminal is connected to the gate terminal of each of the plurality of semiconductor elements through the wiring layer and the plurality of connection wires.

PRIOR ART DOCUMENTS

Patent Document

Patent Document 1: JP-A-2016-225493

SUMMARY OF INVENTION

Problem to be Solved by Invention

The semiconductor element for power which executes high-speed switching operation may generate an unexpected oscillation in the driving signal (e.g., a gate voltage). Once an oscillation occurs in the driving signal, there is a fear that a malfunction occurs in a circuit which includes a semiconductor element for power (a semiconductor device).

In the light of the foregoing, the present disclosure is directed to providing a semiconductor device capable of suppressing the oscillation of driving signals.

Solution to Problem

A semiconductor device according to the first aspect of the present disclosure includes a plurality of first semiconductor elements, each of which has a first electrode, a second electrode, and a third electrode, and is subjected to an ON-OFF control between the first electrode and the second electrode in accordance with a first driving signal input to the third electrode. Further, the semiconductor device includes a first control terminal to which the first driving signal is input, a first wiring portion to which the first control terminal is connected, a second wiring portion separated from the first wiring portion, a first connection member to conduct the first wiring portion and the second wiring portion, and a second connection member to conduct the second wiring portion and the third electrode of one of the plurality of first semiconductor elements. The respective first electrodes of the plurality of first semiconductor elements are electrically connected to one another, and respective second electrodes of the plurality of first semiconductor elements are electrically connected to one another.

A semiconductor device according to the second aspect of the present disclosure includes a plurality of semiconductor elements, each of which has a first electrode, a second electrode, and a third electrode, and is subjected to an ON-OFF control between the first electrode and the second electrode in accordance with a driving signal input to the third electrode. Further, the semiconductor device includes a plurality of control terminals to each of which the driving signal is input, a plurality of wiring portions which are conducted to the plurality of control terminals and to which the plurality of control terminals are bonded, the plurality of connection members which connect the third electrode of each of the plurality of semiconductor elements and the plurality of wirings respectively, and an insulating substrate which has a front surface and a rear surface separated from each other in a thickness direction and on the front surface of which a plurality of wiring portions are formed. Each of the plurality of control terminals extends in a direction in which the front surface faces with respect to the thickness direction.

Technical Effects

According to the above configurations, an oscillation of a driving signal can be suppressed in a semiconductor device.

MODE FOR CARRYING OUT THE INVENTION

Figure 1:
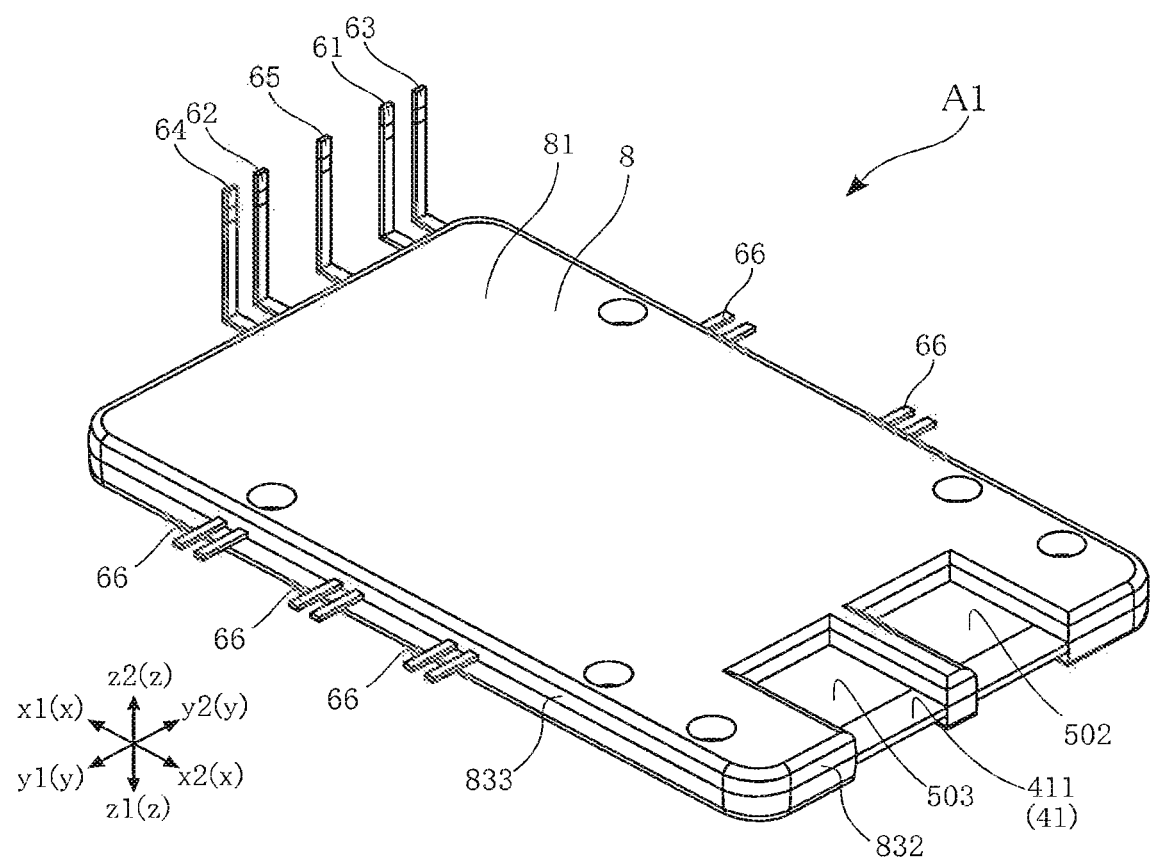
FIG. 1 is a perspective view which shows a semiconductor device according to the first embodiment.

A preferred embodiment of a semiconductor device of the present disclosure is explained below with reference to the accompanying drawings. In the explanations below, the same or similar elements are denoted by the same reference numerals, and redundant description thereof is omitted.

Figure 2:
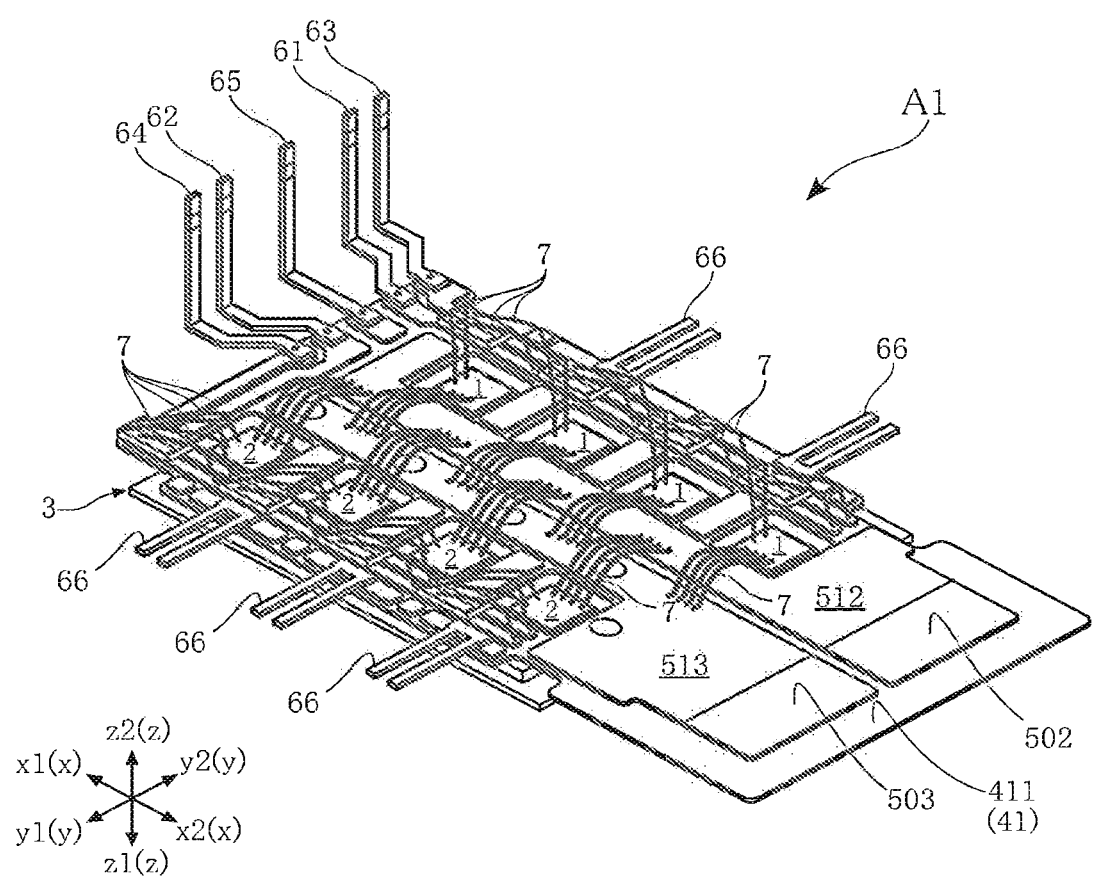
FIG. 2 is the perspective view of FIG. 1 from which a sealing member is omitted.
Figure 3:
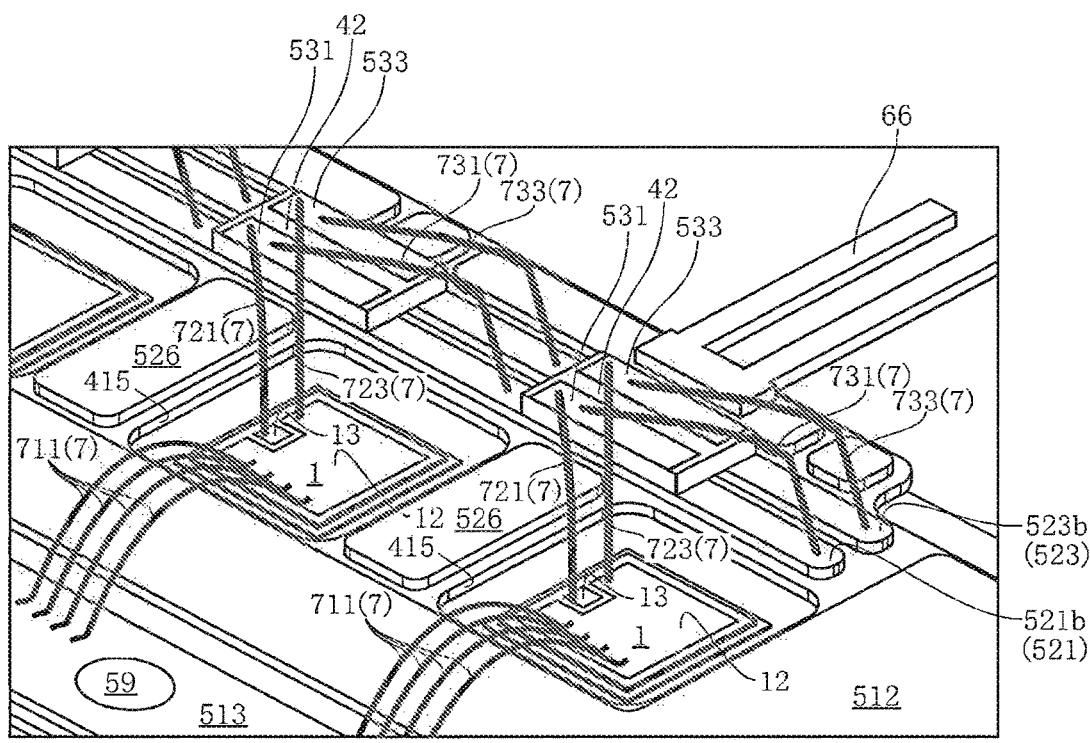
FIG. 3 is a partial enlarged view which enlarges a part of FIG. 2.
Figure 3:
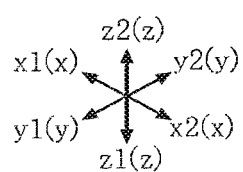
Figure 4:
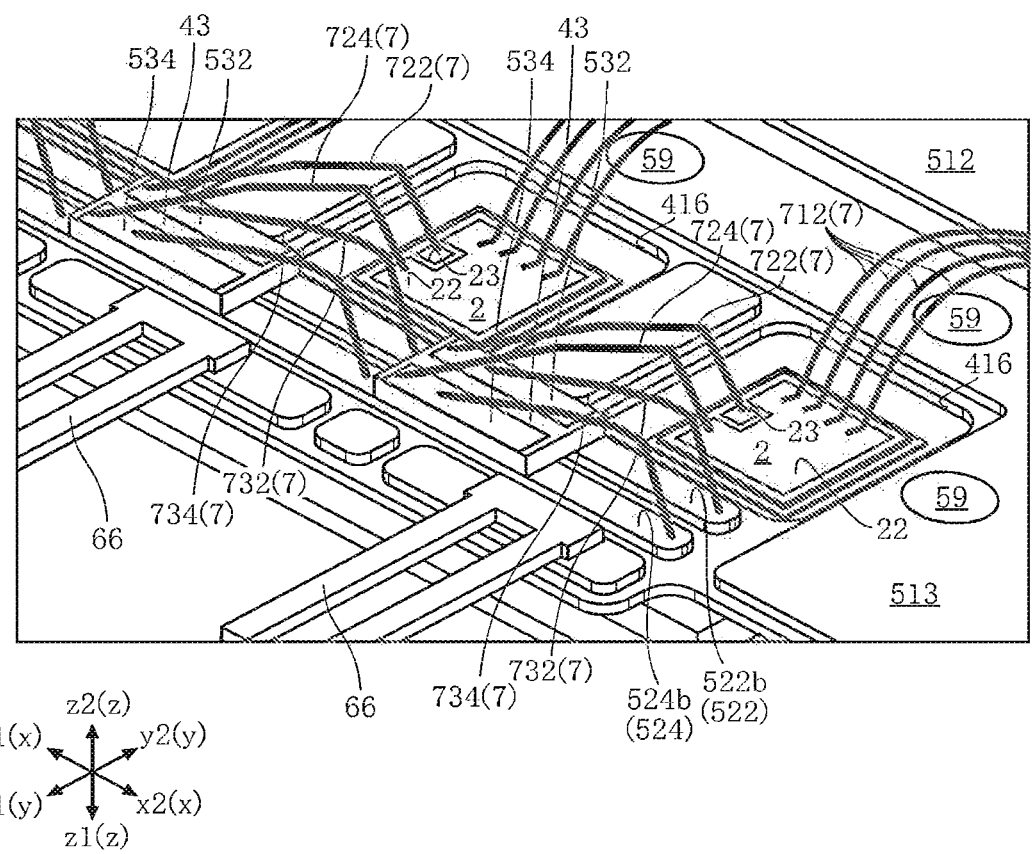
FIG. 4 is a partial enlarged view which enlarges a part of FIG. 2.

FIGS. 1-13 show a semiconductor device A1 according to the first embodiment. The semiconductor device A1 is provided with a plurality of first semiconductor elements 1, a plurality of second semiconductor elements 2, a supporting member 3, a plurality of insulating substrates 41-43, a plurality of wring portions 511-514, 521-528 and 531-534, a plurality of metallic members (conductive metallic members) 58 and 59, a pair of control terminals 61 and 62, a plurality of detection terminals 63-65, a plurality of lateral terminals 66, a plurality of connection members 7, and a sealing member 8. The plurality of connection members 7 are, for example, bonding wires, and include a plurality of connection members 711, 712, 721-724, and 731-734 as shown in FIGS. 3 and 4.

Figure 5:
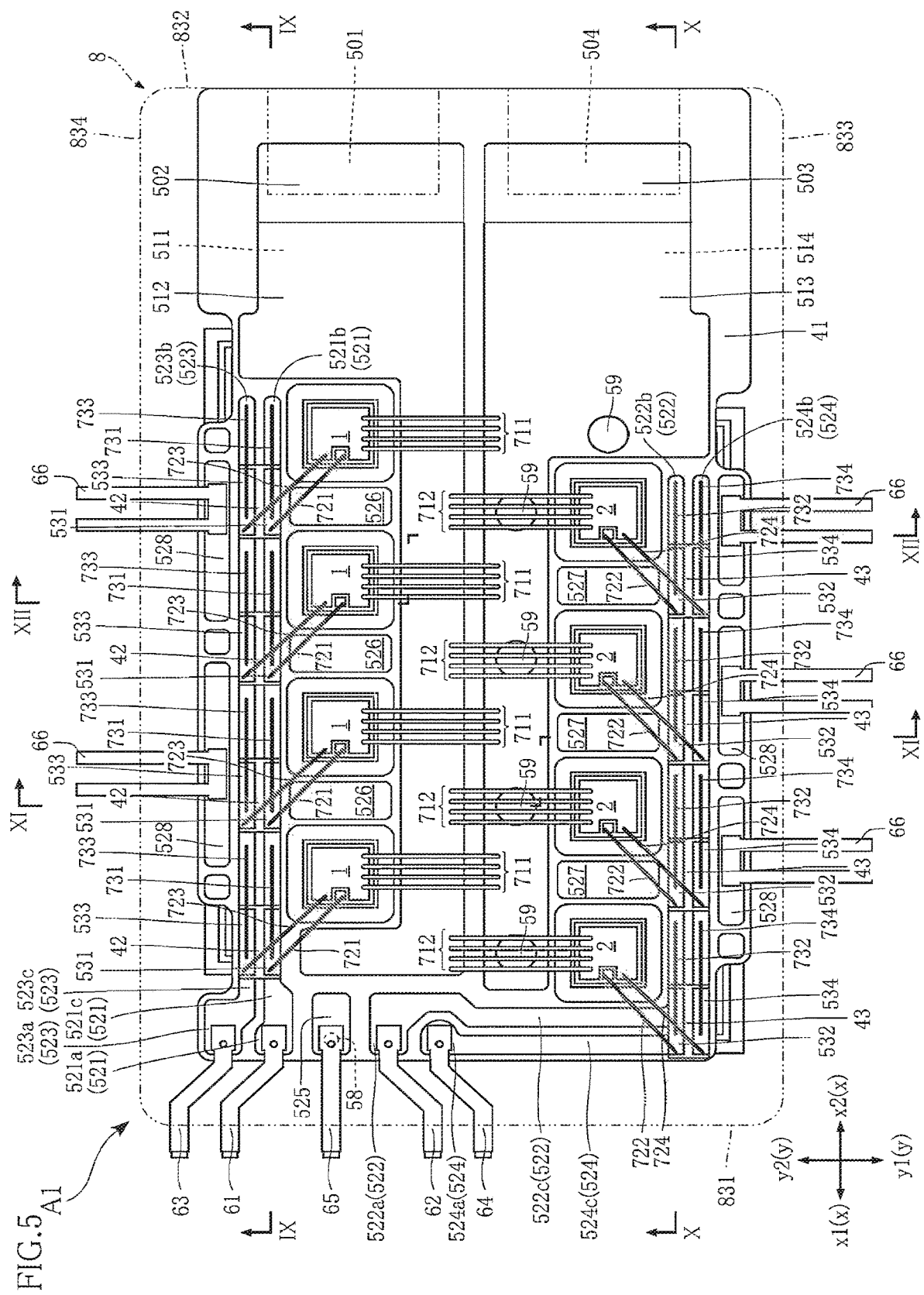
FIG. 5 is a plan view which shows the semiconductor device according to the first embodiment, in which the sealing member is drawn by an imaginary line.
Figure 6:
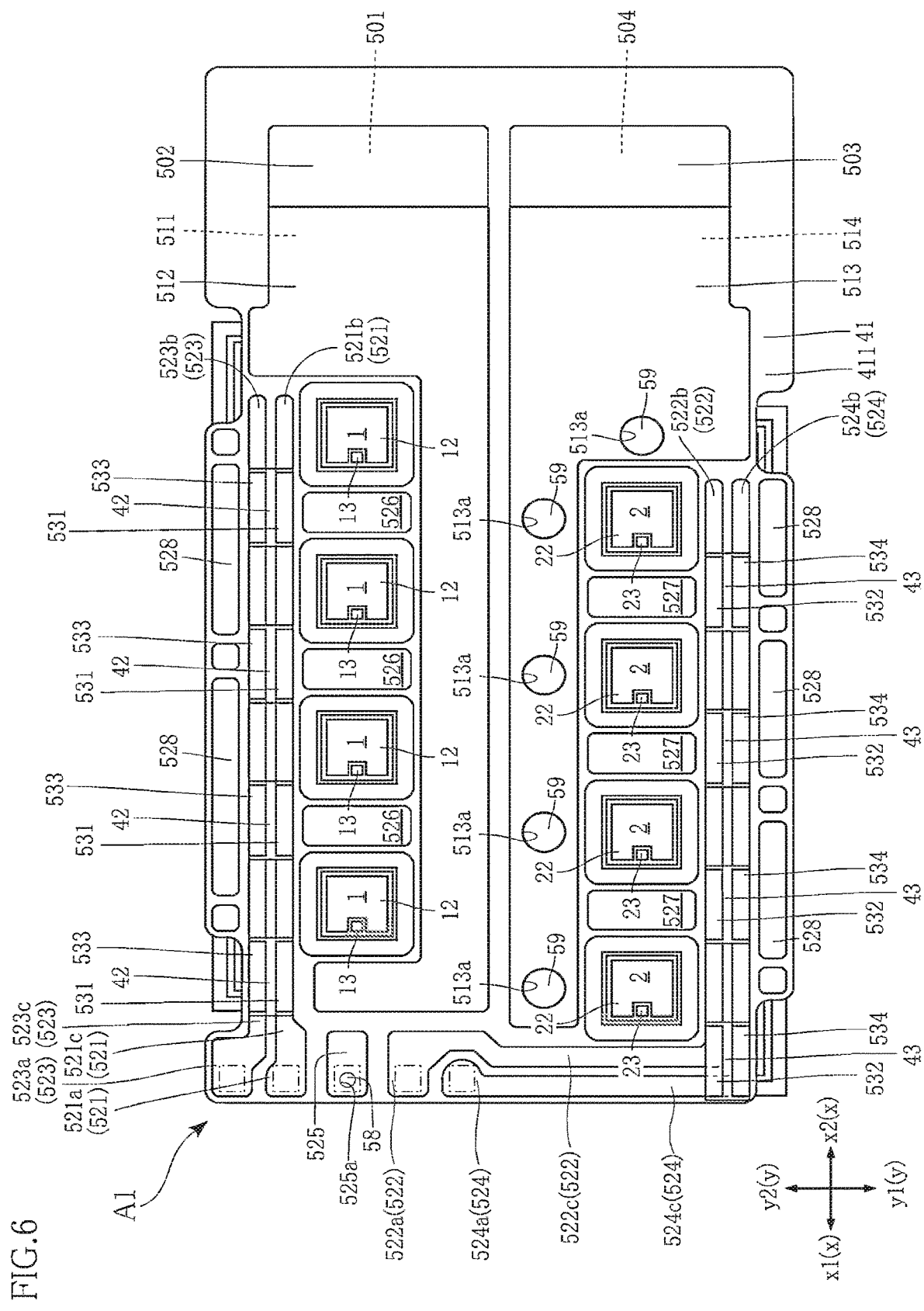
FIG. 6 is the perspective view of FIG. 5 from which the plurality of terminals, the plurality of connection members, and the sealing member are omitted.
Figure 7:
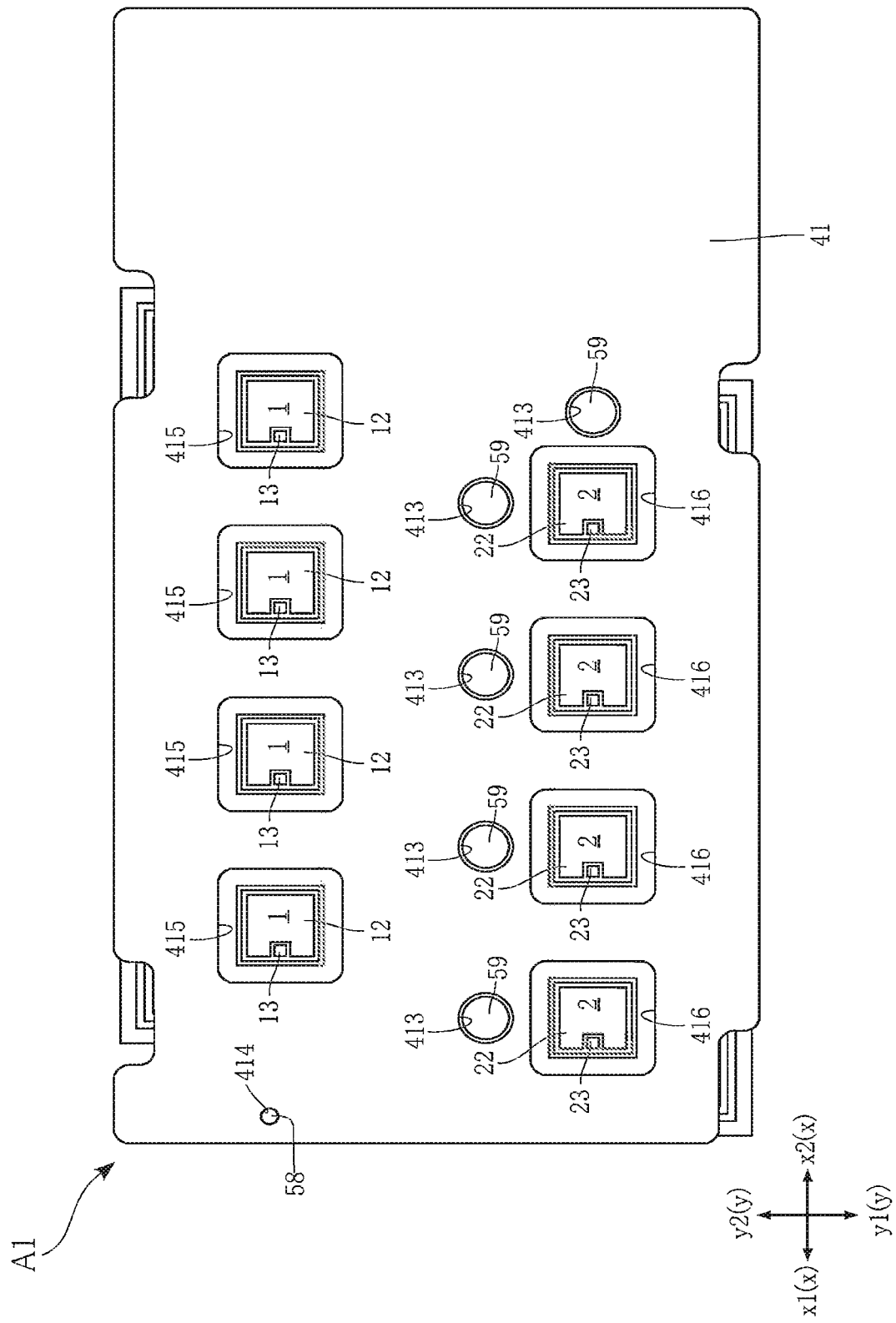
FIG. 7 is the plan view of FIG. 6 from which some of the wiring portions is omitted.
Figure 8:
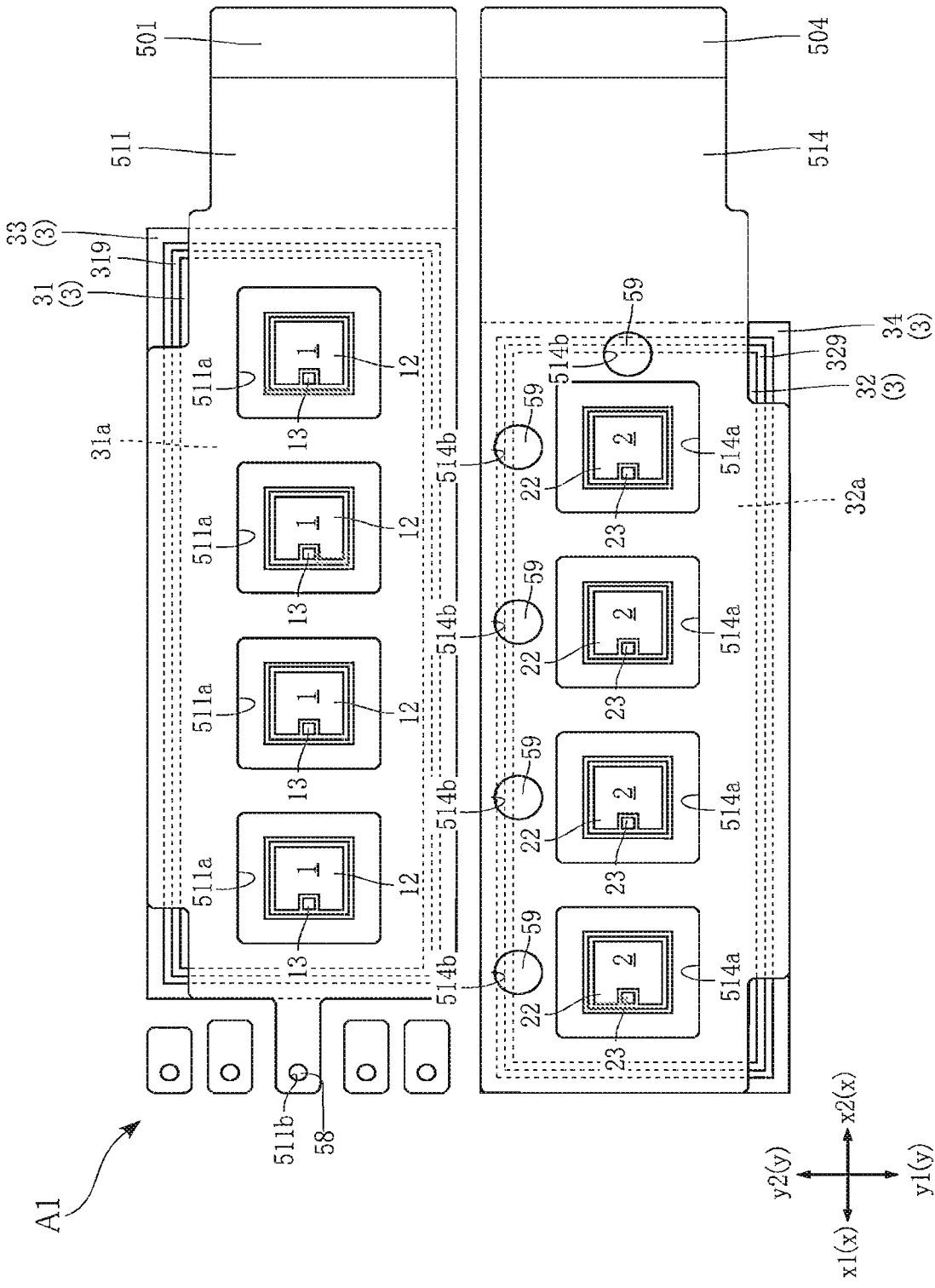
FIG. 8 is the plan view of FIG. 7 from which the insulating substrate is omitted.
Figure 9:
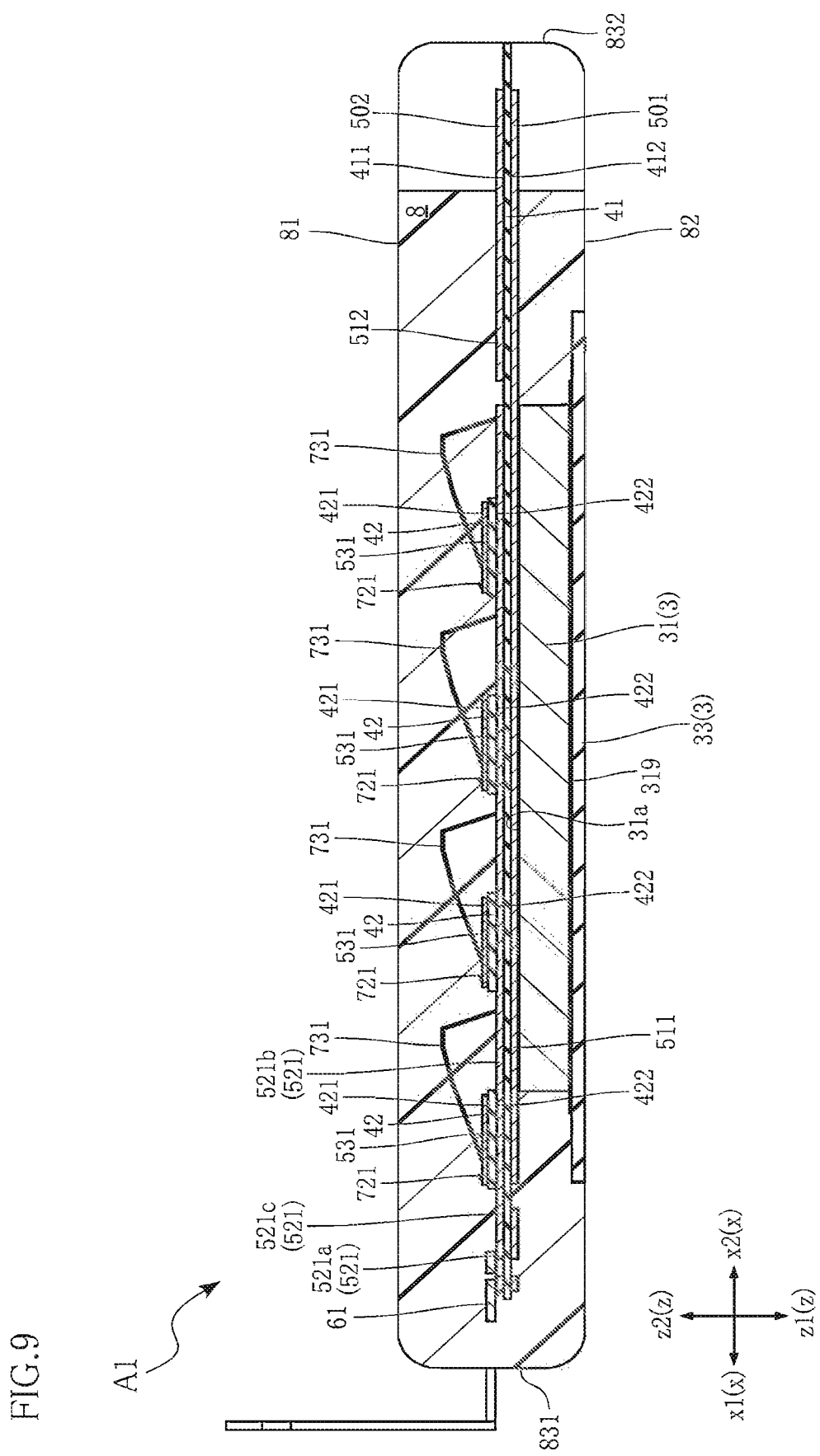
FIG. 9 is a sectional view along IX-IX line of FIG. 5.
Figure 10:
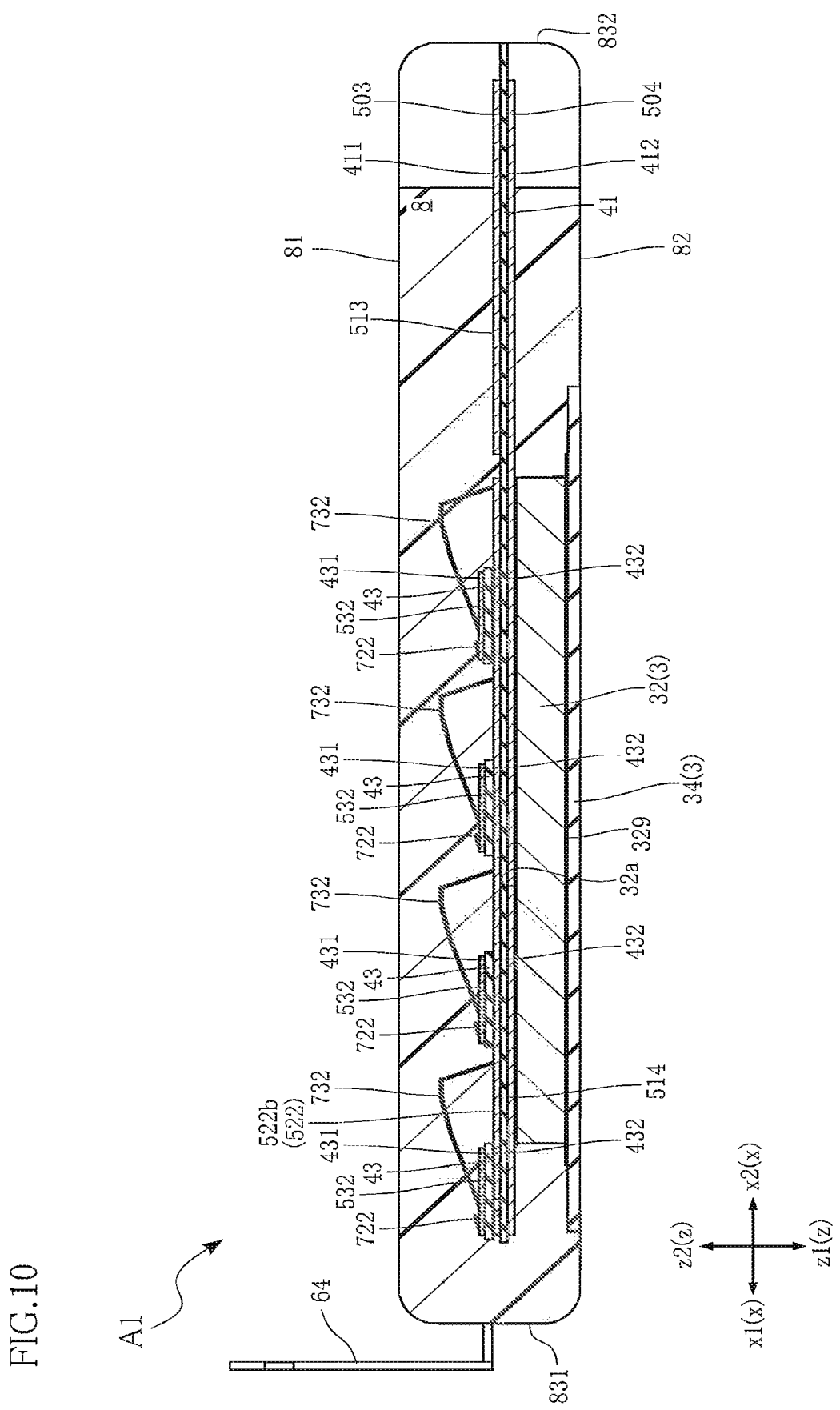
FIG. 10 is a sectional view along X-X line of FIG. 5.
Figure 11:
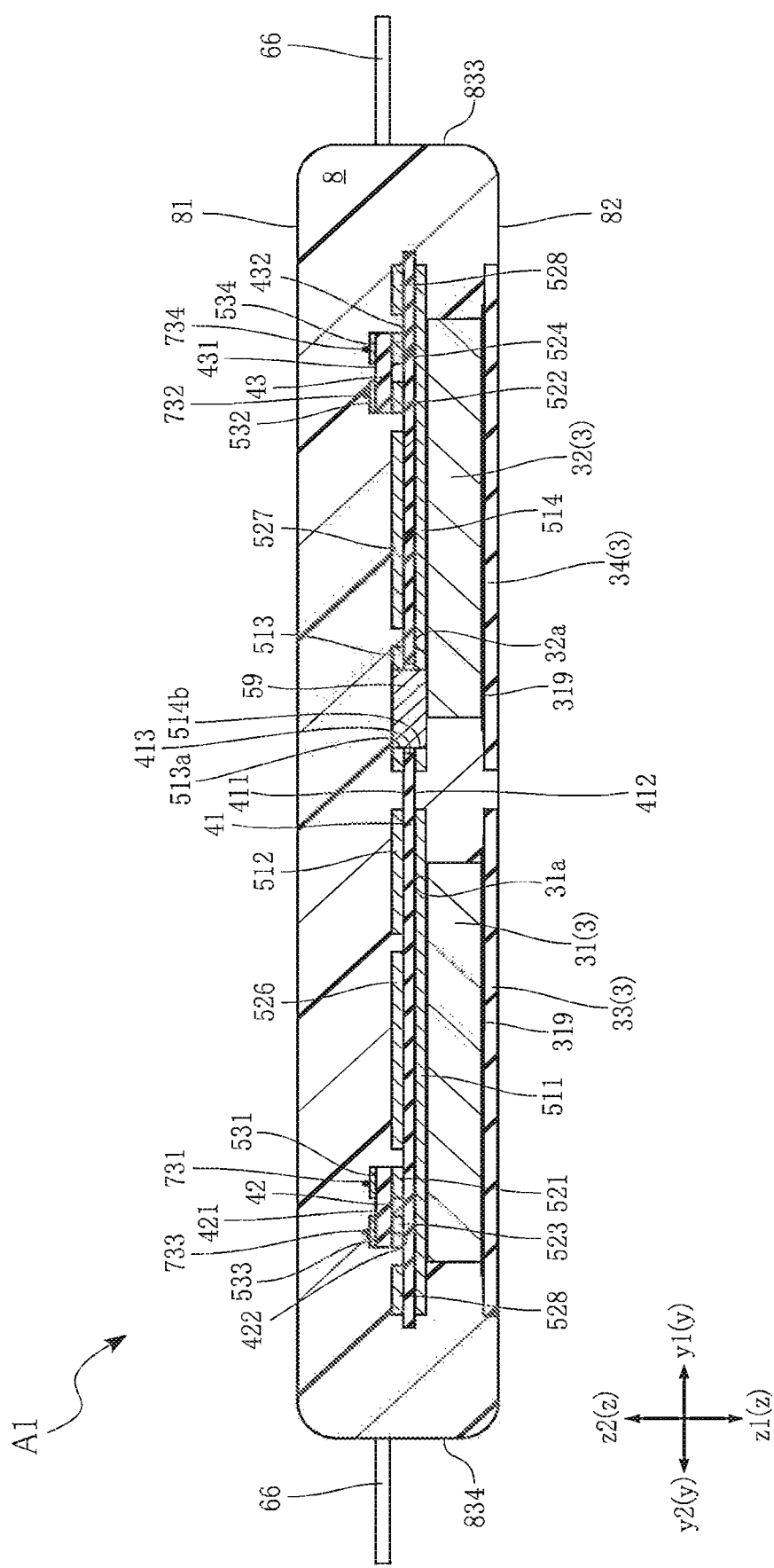
FIG. 11 is a sectional view along XI-XI line of FIG. 5.
Figure 12:
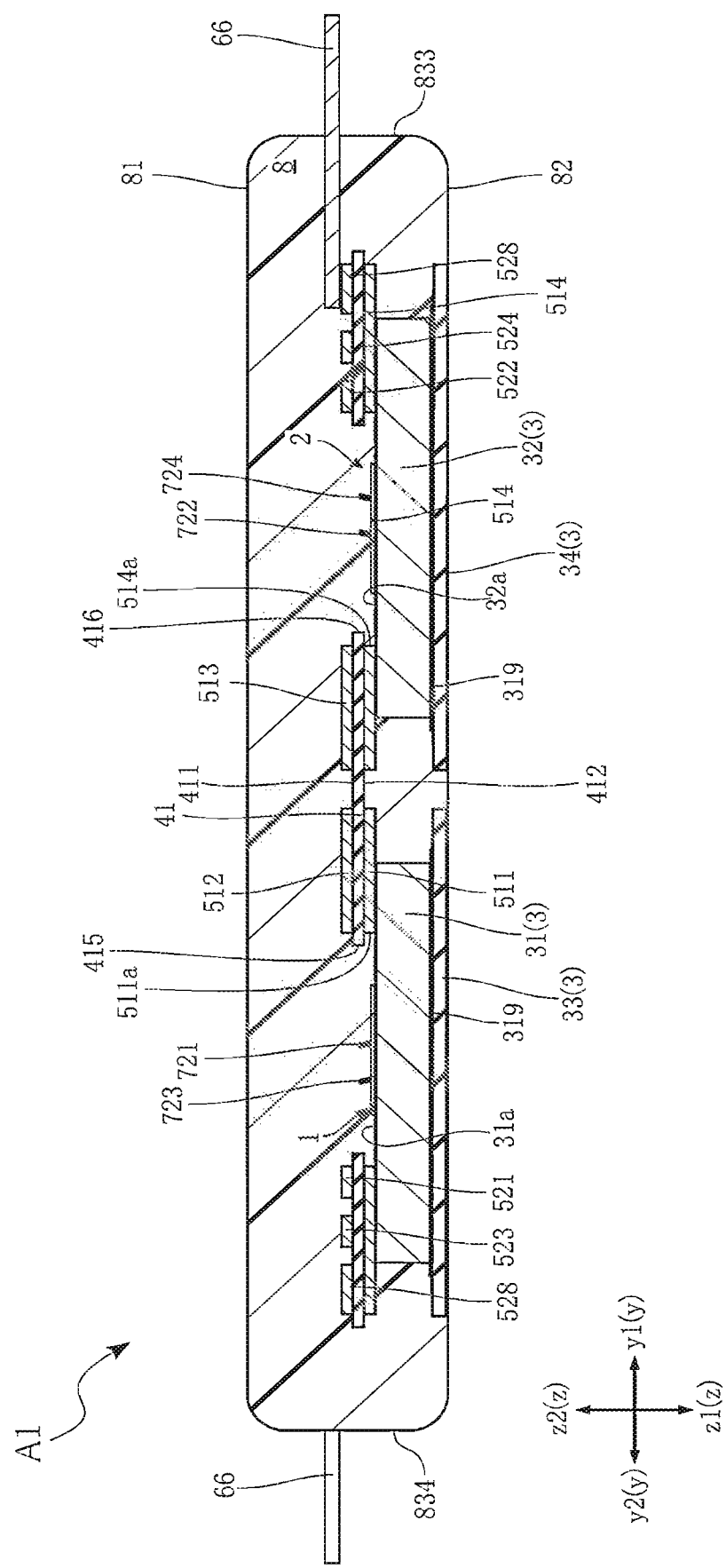
FIG. 12 is a sectional view along XII-XII line of FIG. 5.
Figure 13:
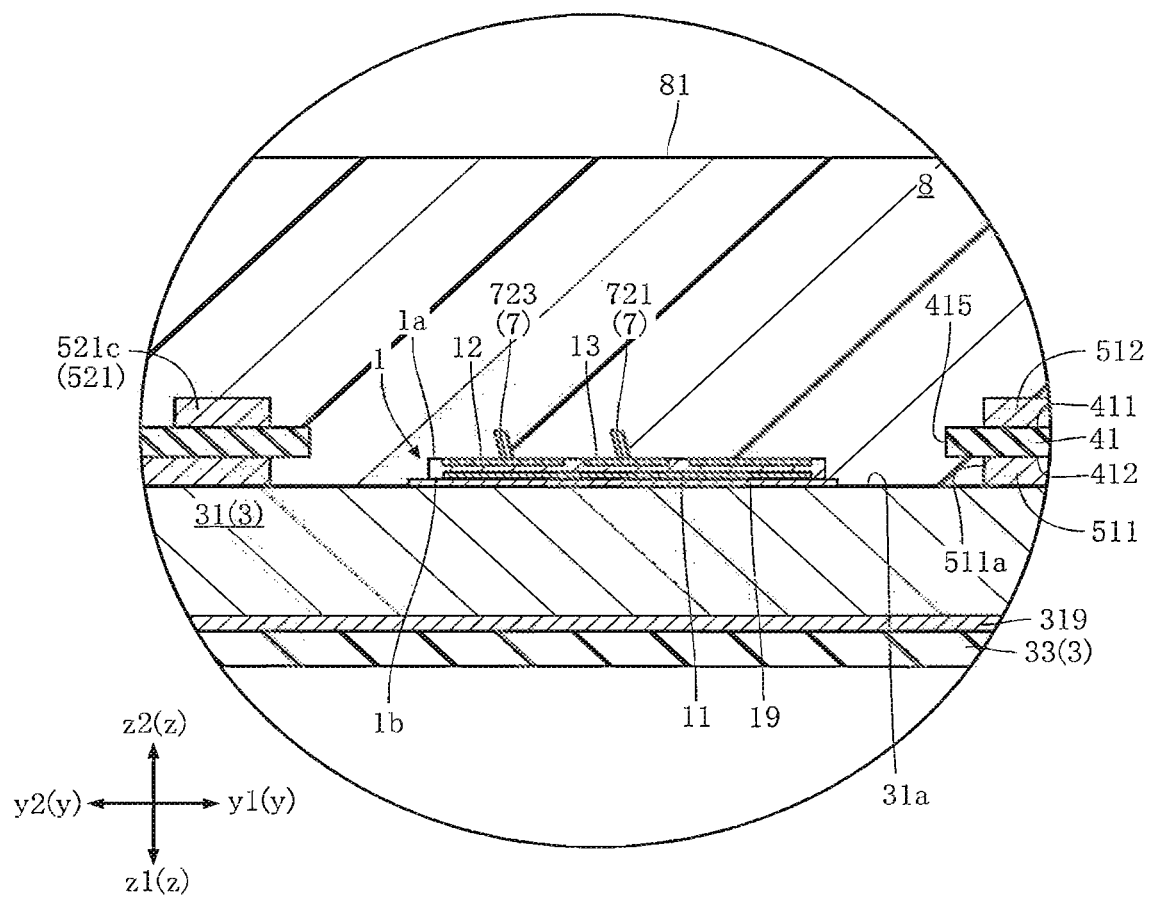
FIG. 13 is a partial enlarged view which enlarges a part of FIG. 12.
Figure 14:
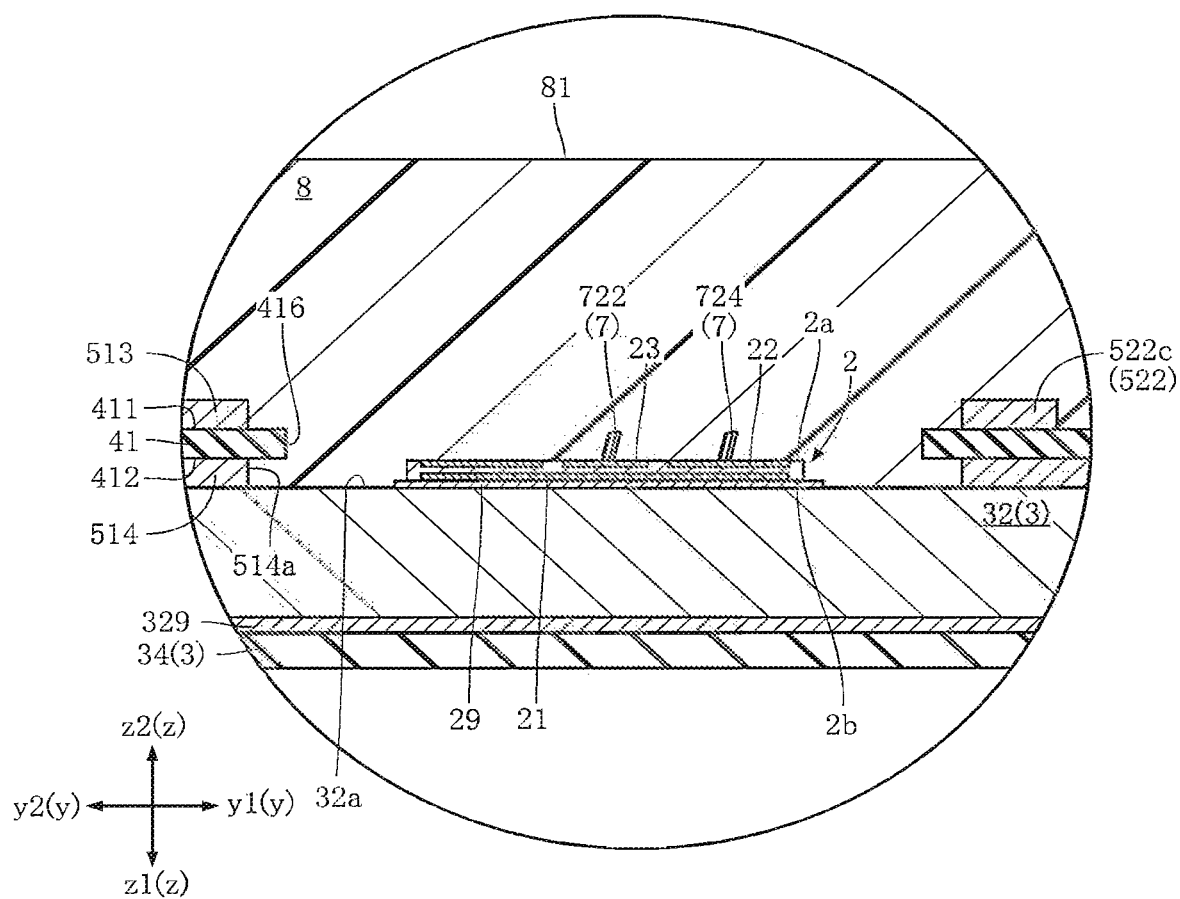
FIG. 14 is a partial enlarged view which enlarges a part of FIG. 12.

FIG. 1 is a perspective view showing the semiconductor device A1. FIG. 2 is a view corresponding to FIG. 1 from which the sealing member 8 is omitted. FIG. 3 is a main part enlarged view which enlarges a part of FIG. 2. FIG. 4 is a main part enlarged view which enlarges a part of FIG. 2. FIG. 5 is a plan view showing the semiconductor device A1, where the sealing member 8 is drawn by an imaginary line (a two-dot chain line). FIG. 6 is a plan view corresponding to FIG. 5 from which the pair of control terminals 61 and 62, the plurality of detection terminals 63-65, the plurality of lateral terminals 66, and the plurality of connection members 7 are omitted. FIG. 7 is a plan view corresponding to FIG. 6 from which the two insulating substrate 42 and 43, and the plurality of wiring portions 512, 513, 521-528, and 531-534 are omitted. FIG. 8 is a plan view corresponding to FIG. 7 from which the insulating substrate 41 is omitted. FIG. 9 is a sectional view along IX-IX line of FIG. 5. FIG. 10 is a sectional view along X-X line of FIG. 5. FIG. 11 is a sectional view along XI-XI line of FIG. 5. FIG. 12 is a sectional view along XII-XII line of FIG. 5. FIG. 13 is a partial enlarged view which enlarges a part of FIG. 12. FIG. 14 is a partial enlarged view which enlarges a part of FIG. 12.

For ease of explanation, three directions orthogonal to one another, that is, x-direction, y-direction and z-direction are referred to as appropriate. The z-direction is, for example, a thickness direction of the semiconductor device A1. The x-direction is a left-right direction in a plan view of the semiconductor device A1 (see FIG. 5). The y-direction is an upward-downward direction in a plan view of the semiconductor device A1 (see FIG. 5). The x-direction is an example of the "first direction", and the y-direction is an example of the "second direction".

Each of the plurality of first semiconductor elements 1 and the plurality of second semiconductor elements 2 is, for example, a MOSFET. They may be field effect transistors including a MISFET (Metal-Insulator-Semiconductor FET) instead of a MOSFET, or other switching elements such as bipolar transistors including an IGBT. Each of the plurality of first semiconductor elements 1 and the plurality of second semiconductor elements 2 is composed of a semiconductor material mainly constituted by SiC (silicon carbide). The semiconductor material is not limited to SiC, but may be Si (silicon), GaAs (gallium arsenide), GaN (gallium nitride), or Ga2O3 (gallium oxide).

Each of the plurality of first semiconductor elements 1 has, as shown in FIG. 13, an element front surface 1a and an element rear surface 1b. The element front surface 1a and the element rear surface 1b are separated from each other in the z-direction. The element front surface 1a faces the z2-direction and the element rear surface 1b faces the z1-direction. The element front surface 1a is an example of the "first element front surface", and the element rear surface 1b is an example of the "first element rear surface".

Each of the plurality of first semiconductor elements 1 has a first electrode 11, a second electrode 12, and a third electrode 13. As shown in FIG. 13, in each of the first semiconductor elements 1, the first electrode 11 is formed on the element rear surface 1b, and the second electrode 12 and the third electrode 13 are formed on the element front surface 1a. In an example where each of the first semiconductor electrodes is a MOSFET, the first electrode 11 is a drain electrode, the second electrode 12 is a source electrode, and the third electrode 13 is a gate electrode. When a first driving signal (e.g., a gate voltage) is input to the third electrode 13 (a gate electrode), each of the first semiconductor element 1 is switched between a conductive state and a shutoff state in accordance with this first driving signal. This operation of switching between the conductive state and the shutoff state is called the switching operation. In the conductive state, a current runs from the first electrode 11 (a drain electrode) to the second electrode 12 (a source electrode), and in the shutoff state, this current does not run. In other words, in accordance with the first driving signal (e.g., a gate voltage) input to the third electrode 13 (a gate electrode), each of the first semiconductor elements 1 is subjected to an ON-OFF control between the first electrode 11 (a drain electrode) and a second electrode 12 (a source voltage). As to the plurality of the first semiconductor elements 1, the respective first electrodes 11 (e.g., drain electrodes) are electrically connected to one another, and the respective second electrodes 12 (e.g., source electrodes) are electrically connected to one another according to the configuration detailed below.

The plurality of first semiconductor elements 1 are disposed in line with the x-direction, as shown in FIGS. 2 and 5. Each of the plurality of first semiconductor elements 1 is bonded to the supporting member 3 (a conductive plate 31) through a conductive bonding member 19 as shown in FIG. 13. The conductive bonding member 19 is composed of solder, metallic paste material, or sintered metal, for example.

Each of the plurality of second semiconductor elements 2 has an element front surface 2a and an element rear surface 2b, as shown in FIG. 14. The element front surface 2a and the element rear surface 2b are separated from each other in the z-direction. The element front surface 2a faces the z2-direction and the element rear surface 2b faces the z1-direction. The element front surface 2a is an example of the "second element front surface" the element rear surface 2b is an example of the "second element rear surface".

Each of the plurality of second semiconductor elements 2 has a fourth electrode 21, a fifth electrode 22 and a sixth electrode 23. As shown in FIG. 14, in each of the second semiconductor elements 2, the fourth electrode 21 is formed on the element rear surface 2b, and the fifth electrode 22 and the sixth electrode 23 are formed on the element front surface 2a. In an example where each of the second semiconductor electrodes 2 is a MOSFET, the fourth electrode 21 is a drain electrode, the fifth electrode 22 is a source electrode, and the sixth electrode 23 is a gate electrode. When a second driving signal (e.g., a gate voltage) is input to the sixth electrode 23 (a gate electrode), each of the second semiconductor element 2 executes the switching operation in accordance with this second driving signal. In the conductive state, a current runs from the fourth electrode 21 (a drain electrode) to the fifth electrode 22 (a source electrode), and in the shutoff state, this current does not run. In other words, in accordance with the second driving signal (e.g., a gate voltage) input to the sixth electrode 23 (a gate electrode), each of the second semiconductor elements 2 is subjected to an on-off control between the fourth electrode 21 (a drain voltage) and the fifth electrode 22 (a source electrode). As to the plurality of the second semiconductor elements 2, the respective fourth electrodes 21 (e.g., drain electrodes) are electrically connected to one another and the respective fifth electrodes 22 (e.g., source electrodes) are electrically connected to one another according to the configuration detailed below.

The plurality of second semiconductor elements 2 are disposed in line with the x-direction, as shown in FIGS. 2 and 5. The plurality of second semiconductor elements 2 are on the y2-directional side more than the plurality of first semiconductor elements 1 are. Each of the plurality of second semiconductor elements 2 is bonded to the supporting member 3 (a conductive plate 32 to be described later) through a conductive bonding member 29 as shown in FIG. 14. The conductive bonding member 29 is composed of solder, metallic paste material, or sintered metal, for example.

The semiconductor device A1 is configured as a half bridge type switching circuit, for example. The plurality of first semiconductor elements 1 constitute an upper arm circuit of the semiconductor device A1, and the plurality of second semiconductor elements 2 constitute a lower arm circuit of the semiconductor device A1. In the semiconductor device A1, the plurality of first semiconductor elements 1 are electrically connected to one another in parallel, and the plurality of second semiconductor elements 2 are electrically connected to one another in parallel. Further, the first semiconductor elements 1 and the second semiconductor elements 2 are electrically connected to one another in series. In the illustrated example, the semiconductor device A1 is provided with four first semiconductor elements 1 and four second semiconductor elements 2 (see FIGS. 2 and 5). The numbers of the first semiconductor elements 1 and the second semiconductor elements 2 are not limited to this configuration, and are determined as appropriate in accordance with the desired performance of the semiconductor device A1.

The supporting member 3 supports the plurality of first semiconductor elements 1 and the plurality of second semiconductor elements 2 as shown in FIGS. 8-14. The supporting member 3 includes a pair of conductive plates 31 and 32 and a pair of insulating plates 33 and 34 as shown in FIGS. 8-14.

Each of the conductive plates 31 and 32 are made of a conductive material, and are copper or copper alloy, for example. Each of the conductive plates 31 and 32 may be a laminate formed by alternately laminating a layer made of copper and a layer made of molybdenum in the z-direction, for example. In this case, as to each of the conductive plates 31 and 32, the two surface layers respectively facing the z1-direction and the z2-direction are layers made of copper.

A shown in FIGS. 8, 12 and 13, on the conductive plate 31 the plurality of first semiconductor elements 1 are mounted, and the conductive plate supports them. The conductive plate 31 is conducted to the first electrode 11 (a drain electrode) of each of the first semiconductor elements 1. Therefore, the first electrodes 11 of the plurality of first semiconductor elements 1 are conducted to each other through the conductive plate 31. The conductive plate 31 has a cuboid shape, for example. The dimension of the conductive plate 31 along the z-direction is larger than that of the insulating substrate 41. The conductive plate 31 is an example of the "first mounting portion".

As shown in FIGS. 9 and 11-13, the conductive plate 31 has a mounting surface 31a facing the z2-direction. To the mounting surface 31a, the respective first semiconductor elements 1 are bonded, and the wiring portion 511 is bonded. As shown in FIGS. 9 and 13, the conductive plate 31 is connected to the insulating plate 33 through a bonding member 319. The bonding member 319 may be either conductive or insulating.

As shown in FIGS. 8, 12 and 14, the plurality of second semiconductor elements 2 are mounted on the conductive plate 32, and the conductive plate 32 supports them. The conductive plate 32 is conducted to the fourth electrode 21 (a drain electrode) of each of the second semiconductor elements 2. Therefore, the fourth electrodes 21 of the plurality of second semiconductor elements 2 are conducted to each other through the conductive plate 32. The conductive plate 32 has a cuboid shape, for example. The dimension of the conductive plate 32 along the z-direction is larger than that of the insulating substrate 41. The conductive plate 32 is an example of the "second mounting portion".

As shown in FIGS. 10, 12 and 14, the conductive plate 32 has a mounting surface 32a facing the z2-direction. To the mounting surface 32a, the respective second semiconductor elements 2 are bonded, and the wiring portion 514 is bonded. As shown in FIGS. 10 and 14, the conductive plate 32 is connected to the insulating plate 34 through a bonding member 329. The bonding member 329 may be either conductive or insulating.

Both of the insulating plates 33 and 34 are made of an insulating material, and the insulating material is Al2O3, for example. Both of the insulating plates 33 and 34 are rectangular when viewed in the z-direction (hereinafter referred to as "in plan view"), as shown in FIG. 8. As shown in FIGS. 8, 9 and 11-13, the insulating plate 33 supports the conductive plate 31. As shown in FIGS. 8, 10-12 and 14, the insulating plate 34 supports the conductive plate 32. A plating layer may be formed on surfaces of the insulating plates 33 and 34 to which the conductive plates 31 and 32 are bonded respectively. The plating layer is made of silver or silver alloy, for example.

The insulating substrate 41 is made of an insulating material, and is made of glass epoxy resin, for example. Instead of glass epoxy resin, it may be constituted by ceramics such as AlN (aluminum nitride), SiN (silicon nitride), and Al2O3 (aluminum oxide). The insulating substrate 41 is an example of the "first insulating substrate".

The insulating substrate 41 has, as shown in FIGS. 9-14, a front surface 411 and a rear surface 412. The front surface 411 and the rear surface 412 are separated from each other in the z-direction. The front surface 411 faces the z2-direction, and the rear surface 412 faces the z1-direction. The front surface 411 is an example of the "first front surface", and the rear surface 412 is an example of the "first rear surface".

The insulating substrate 41 includes, as shown in FIGS. 7 and 11-14, a plurality of through holes 413, one through hole 414, a plurality of opening portions 415 and a plurality of opening portions 416.

Each of the plurality of through holes 413 penetrates, as shown in FIG. 11, the insulating substrate 41 from the front surface 411 to the rear surface 412 in the z-direction. As shown in FIGS. 7 and 11, the metallic member 59 is inserted in each of the through hole 413. The inner surface of the through hole 413 does not touch the metallic member 59, as shown in FIGS. 7 and 11. Unlike this configuration, the inner surface of each through hole 413 may touch the metallic member 59. In the present disclosure, the phrase "be inserted in" indicates a state where a member in question (for example, each metallic member 59) is inside a through hole in question (for example, each through hole 413), regardless of whether the member in question touches the inner surface of the through hole in question. Note that an insulating member other than the insulating substrate 41 may be formed in a gap between the metallic member 59 and the through hole 413.

The through hole 414 penetrates the insulating substrate 41 from the front surface 411 to the rear surface 412 in the z-direction. The metallic member 58 is inserted in the through hole 414 as shown in FIG. 7. In the illustrated example, the inner surface of the through hole 414 touches the metallic member 58 (see FIG. 7), but the inner surface of the through hole 414 does not have to touch the metallic member 58.

The plurality of opening portions 415 respectively penetrate, as shown in FIGS. 7, 12 and 13, the insulating substrate 41 from the front surface 411 to the rear surface 412 in the z-direction. As shown in FIG. 7, each opening portion 415 surrounds the corresponding one of the first semiconductor elements 1 in plan view. Each opening portion 415 is an example of the "first opening portion".

Each of the plurality of the opening portions 416 penetrates, as shown in FIGS. 7, 12 and 14, the insulating substrate 41 from the front surface 411 to the rear surface 412 in the z-direction. As shown in FIG. 7, each opening portion 416 surrounds the corresponding one of the second semiconductor elements 2 in plan view. Each opening portion 416 is an example of the "second opening portion".

Each of the pluralities of insulating substrates 42 and insulating substrates 43 is made of an insulating material, and is made of, for example, glass epoxy resin, as the insulating substrate 41. Each of the insulating substrates 42 and 43 may be made of ceramics such as AlN (aluminum nitride), SiN (silicon nitride), and Al2O3 (aluminum oxide) instead of glass epoxy resin. Each of the insulating substrates 42 and 43 is, for example, a plate material having a rectangular shape in plan view.

The plurality of insulating substrates 42 are disposed in line with the x-direction. The plurality of insulating substrates 42 are disposed in line with the x-direction with an offset from the respective first semiconductor elements 1. In the example shown in FIG. 5 (see FIGS. 3 and 6 as well), each insulating substrate 42 is offset in the x-direction with respect to a corresponding first semiconductor element 1 toward the control terminal 61 and the detection terminal 63. Each insulating substrate 42 is an example of the "second insulating substrate". Each insulating substrate 42 has, as shown in FIGS. 9 and 11, a front surface 421 and a rear surface 422. The front surface 421 and the rear surface 422 are separated from each other in the z-direction. The front surface 421 faces the z2-direction, and the rear surface 422 faces the z1-direction. The rear surface 422 of each insulating substrate 42 is opposed to the front surface 411. The front surface 421 is an example of the "second front surface", and the rear surface 422 is an example of the "second rear surface".

The plurality of insulating substrates 43 are disposed in line with the x-direction. The plurality of insulating substrates 43 are disposed in line with the x-direction with an offset from the respective second semiconductor elements 2. In the example shown in FIG. 5 (see FIGS. 4 and 6 as well), each insulating substrate 43 is offset in the x-direction with respect to a corresponding second semiconductor element 2 toward the control terminal 62 and the detection terminal 64. Each insulating substrate 43 is an example of the "third insulating substrate". Each insulating substrate 43 has, as shown in FIGS. 10 and 11, a front surface 431 and a rear surface 432. The front surface 431 and the rear surface 432 are separated from each other in the z-direction. The front surface 431 faces the z2-direction, and the rear surface 432 faces the z1-direction. The rear surface 432 of each insulating substrate 43 is opposed to the front surface 411. The front surface 431 is an example of the "third front surface", and the rear surface 422 is an example of the "third rear surface".

The plurality of wiring portions 511-514, 521-528, and 531-534 constitute a conductive route in the semiconductor device A1, together with a part of the supporting member 3 (the conductive plates 31 and 32), the metallic members 58 and 59, and the plurality of connection members 711, 712, 721-724, and 731-734. The plurality of wiring portions 511-514, 521-528, and 531-534 are separated from one another. The plurality of wiring portions 511-514, 521-528, and 531-534 are copper or copper alloy, for example. The thickness (the dimension along the z-direction) and the constituent material of each of the plurality of wiring portions 511-514, 521-528, and 531-534 is changed as appropriate according to specifications of the semiconductor device A1 (a rated current, an allowable current, a rated voltage, a voltage resistance, and an internal inductance and a size of the device as a whole).

The plurality of wiring portions 511-514 constitute a conductive route of a primary current in the semiconductor device A1. In the semiconductor device A1, the wiring portion 511 and the wiring portion 512 overlap with each other (see FIGS. 6 and 9), and the wiring portion 513 and the wiring portion 514 overlap with each other (see FIGS. 6 and 10), in plan view.

The wiring portion 511 is formed on the rear surface 412 of the insulating substrate 41. The wiring portion 511 is, as shown in FIGS. 9 and 11-13, bonded to the mounting surface 31a of the conductive plate 31. The wiring portion 511 is conducted to the first electrode 11 (a drain electrode) of each of the plurality of first semiconductor elements 1 through the conductive plate 31.

The wiring portion 511 includes, as shown in FIGS. 8, 12 and 13, a plurality of opening portions 511a and at least one through hole 511b. As shown in FIGS. 12 and 13, the plurality of openings 511a are opened in the z-direction. As can be seen from FIGS. 12 and 13, the plurality of the opening portions 511a respectively overlap the plurality of opening portion 415 of the insulating substrate 41 in plan view. As shown in FIG. 8, each opening portion 511a surrounds a corresponding one of the first semiconductor elements 1 in plan view. The through holes 511b penetrates the wiring portion 511 in the z-direction. As shown in FIG. 8, the metallic member 58 fits in the through hole 511b.

The wiring portion 512 is formed on the front surface 411 of the insulating substrate 41. The wiring portion 512 is, as can be seen from FIGS. 5 and 6, conducted to the fifth electrode 22 (a source electrode) of each second semiconductor element 2 through the plurality of connection member 712. The wiring portion 512 is formed so as to avoid the plurality of first semiconductor elements 1 in plan view.

The wiring portion 513 is formed on the front surface 411 of the insulating substrate 41. The wiring portion 513 is dislocated in the y1-direction from the wiring portion 512 in plan view. The wiring portion 513 is, as can be seen from FIGS. 5 and 6, conducted to the second electrode 12 (a source electrode) of each first semiconductor element 1 through the plurality of connection members 711. Further, the wiring portion 513 is conducted to the fourth electrode 21 (a drain electrode) of each second semiconductor element 2 through the wiring portion 514 and the respective metallic members 59, according to the configuration detailed below. The wiring portion 513 is formed so as to avoid each of the plurality of semiconductor elements 2 in plan view.

The wiring portion 513 includes, as shown in FIGS. 6 and 11, a plurality of through holes 513a. As shown in FIGS. 6 and 11, one metallic member 59 from among the plurality of metallic members 59 fits in each through hole 513a. As shown in FIGS. 6 and 11, an inner surface of each through hole 513a touches the metallic member 59. In the present disclosure, the phrase "fit in" indicates a state where a member in question (for example, each metallic member 59) is inside a through hole in question (for example, each through hole 513a), and the member in question touches the inner surface of the through hole in question. That is, the "fit in" state corresponds to a state of touching the inner surface of the through hole as a part of the "be inserted in" state. In the illustrated example, each through hole 513a is circular in plan view (see FIG. 6), but is changed as appropriate according to the shape of each metallic member 59.

The wiring portion 514 is formed on the rear surface 412 of the insulating substrate 41. The wiring portion 514 is, as shown in FIGS. 8, 10-12 and 14, bonded to the mounting surface 32a of the conductive plate 32. The wiring portion 514 is conducted to the fourth electrode 21 (a drain electrode) of each of the plurality of second semiconductor elements 2 through the conductive plate 32. Further, the wiring portion 514 is, according to the configuration to be detailed later, is conducted to the second electrode 12 (a source electrode) of each first semiconductor element 1 through the wiring portion 513 and the metallic member 59.

The wiring portion 514 includes, as shown in FIGS. 8, 11, 12 and 14, a plurality of opening portions 514a and a plurality of through holes 514b. As shown in FIG. 12, the plurality of opening portions 514a are opened in the z-direction. As can be seen from FIGS. 12 and 14, the plurality of opening portions 514 respectively overlaps with the plurality of opening portions 416 of the insulating substrate 41 in plan view. As shown in FIG. 8, each opening portion 514a surrounds a corresponding one of the second semiconductor elements 2 in plan view. As shown in FIG. 11, the plurality of through holes 514b respectively penetrate the wiring portions 514 in the z-direction. In plan view, the plurality of the through holes 514b respectively overlap with the plurality of through holes 513a of the wiring portions 513. The metallic member 59 fits in each through holes 514b.

In the semiconductor device A1, the wiring portion 511 includes a first power terminal portion 501 located at the edge on the x2-direction side. The first power terminal portion 501 is conducted to the first electrode 11 (a drain electrode) of each of the plurality of first semiconductor elements 1. The wiring portion 512 includes a second power terminal portions 502 located at the edge on the x2-direction side. The second power terminal portion 502 is conducted to the firth electrode 22 (a source electrode) of each of the plurality of the second semiconductor elements 2. The wiring portion 513 includes a third power terminal portion 503 located at the edge on the x2-direction side. The third power terminal portion 503 is conducted to the second electrode 12 (a source electrode) of each of the plurality of the first semiconductor elements 1 and the fourth electrode 21 (a drain electrode) of each of the plurality of the second semiconductor elements 2. The wiring portion 514 includes a fourth power terminal portion 504 located at the edge on the x2-direction side. The fourth power terminal portion 504 is conducted to the second electrode 12 (a source electrode) of each of the plurality of first semiconductor elements 1 and the fourth electrode 21 (a drain electrode) of each of the plurality of second semiconductor elements 2.

The first power terminal portion 501, the second power terminal portion 502, the third power terminal portion 503, and the fourth power terminal portion 504 are separated from one another, and each of them are exposed from the sealing member 8. On the respective surfaces of the first power terminal portion 501, the second power terminal portion 502, the third power terminal portion 503 and the fourth power terminal portion 504, plating is applied.

The first power terminal portion 501 and the second power terminal portion 502 overlap with each other in plan view. The third power terminal portion 503 and the fourth power terminal portion 504 overlap with each other in plan view. In the illustrated example, the semiconductor device A1 includes the third power terminal portion 503 and the fourth power terminal portion 504, but unlike this configuration it may be configured to include only one of the third power terminal portion 503 and the fourth power terminal portion 504.

The first power terminal portion 501 and the second power terminal portion 502 are connected to an external direct current power source, for example, and a power voltage (direct current voltage) is applied thereto. In the semiconductor device A1, the first power terminal portion 501 is a p-terminal connected to a cathode of the direct current power source, and the second power terminal portion 502 is an n-terminal connected to an anode of the direct current power source. The direct current voltage applied to the first power terminal portion 501 and the second power terminal portion 502 is converted to an alternate current voltage by the respective switching operations of the plurality of first semiconductor elements 1 and the respective switching operations of the plurality of second semiconductor elements 2. The converted voltage (the alternate current voltage) is output from the third power terminal portion 503 and the fourth power terminal portion 504 respectively.

The plurality of wiring portions 521-525 and 531-534 constitute conductive routes of a control signal in the semiconductor device A1.

The wiring portion 521 is formed on the front surface 411 of the insulating substrate 41. To the wiring portion 521, as shown in FIG. 5, the control terminal 61 is connected. The wiring portion 521 is an example of the "first wiring portion". As shown in FIGS. 5 and 6, the wiring portion 521 includes the pad portion 521*a*, the band-like portion 521*b* and the connection portion 521*c*. The pad portion 521*a* is a portion of the wiring portion 521 to which the control terminal 61 is bonded. The band-like portion 521*b* extends in the x-direction in plan view. The band-like portion 521*b* is located on one side with respect to the x-direction (in the examples shown in FIGS. 5 and 6, on the x2-directional side) when seen from the pad portion 521*a*. The band-like portion 521*b* is an example of the "first band-like portion". The connection portion 521*c* connects the pad portion 521*a* and the band-like portion 521*b*.

A wiring portion 522 is formed on the front surface 411 of the insulating substrate 41. To the wiring portions 522, as shown in FIG. 5, the control terminal 62 is connected. The wiring portion 522 is an example of the "fifth wiring portion". As shown in FIGS. 5 and 6, the wiring portion 522 includes the pad portion 522*a*, the band-like portion 522*b* and the connection portion 522*c*. The pad portion 522*a* is a portion of the wiring portion 522 to which the control terminal 62 is bonded. The band-like portion 522*b* extends in the x-direction in plan view. The band-like portion 522*b* is located on one side with respect to the x-direction (in the examples shown in FIGS. 5 and 6, on the x2-direction side) when seen from the pad portion 522*a*. The band-like portion 522*b* is an example of the "third band-like portion". The connection portion 522*c* connects the pad portion 522*a* and the band-like portion 522*b*.

The wiring portion 523 is formed on the front surface 411 of the insulating substrate 41. To the wiring portions 523, as shown in FIG. 5, the detection terminal 63 is connected. The wiring portion 523 is an example of the "third wiring portion". As shown in FIGS. 5 and 6, the wiring portion 523 includes the pad portion 523*a*, the band-like portion 523*b* and the connection portion 523*c*. The pad portion 523*a* is a portion of the wiring portion 523 to which the detection terminal 63 is bonded. The band-like portion 523*b* extends in the x-direction in plan view. The band-like portion 523*b* is located on one side with respect to the x-direction (in the examples shown in FIGS. 5 and 6, on the x2-direction side) when seen from the pad portion 523*a*. The band-like portion 523*b* is an example of the "second band-like portion". The connection portion 523*c* connects the pad portion 523*a* and the band-like portion 523*b*.

The wiring portion 524 is formed on the front surface 411 of the insulating substrate 41. To the wiring portions 524, as shown in FIG. 5, the control terminal 64 is connected. The wiring portion 524 is an example of the "seventh wiring portion". As shown in FIGS. 5 and 6, the wiring portion 524 includes the pad portion 524*a*, the band-like portion 524*b* and the connection portion 524*c*. The pad portion 524*a* is a portion of the wiring portion 524 to which the control terminal 64 is bonded. The band-like portion 524*b* extends in the x-direction in plan view. The band-like portion 524*b* is located on one side with respect to the x-direction (in the examples shown in FIGS. 5 and 6, on the x2-direction side) when seen from the pad portion 524*a*. The band-like portion 524*b* is an example of the "fourth band-like portion". The connection portion 524*c* connects the pad portion 524*a* and the band-like portion 524*b*.

As shown in FIGS. 5 and 6, when seen from the plurality of first semiconductor elements 1, the band-like portion 521*b* of the wiring portion 521 and the band-like portion 523*b* of the wiring portion 523 are located on a side opposite, with respect to the y-direction, to the side where the plurality of second semiconductor elements 2 are arranged (that is, the y2-directional side). The band-like portion 521*b* and the band-like portion 523*b* are arranged so that their respective longitudinal directions are parallel to each other. In the illustrated example, although the band-like portion 523*b* is located on the side opposite, with respect to the y-direction, to the side where the plurality of first semiconductor elements 1 are arranged, when seen from the band-like portion 521*b* (that is, the y2-directional side) (see FIGS. 5 and 6), the positional relationship between the band-like portion 521*b* and the band-like portion 523*b* may be flipped. In the semiconductor device A1, the plurality of insulating substrate 42 are respectively arranged on the band-like portion 521*b* and the band-like portion 523*b*, and are over both of these.

As shown in FIGS. 5 and 6, when seen from the plurality of second semiconductor elements 2, the band-like portion 522*b* of the wiring portion 522 and the band-like portion 524*b* of the wiring portion 524 are located on a side opposite, with respect to the y-direction, to the side where the plurality of second semiconductor elements 2 are arranged (that is, the y1-directional side). The band-like portion 522*b* and the band-like portion 524*b* are arranged so that their respective longitudinal directions are parallel to each other. In the illustrated example, although the band-like portion 524*b* is located on the side opposite, with respect to the y-direction, to the side where the plurality of second semiconductor elements 2 are arranged when seen from the band-like portion 522*b* (that is, the y1-directional side) (see FIGS. 5 and 6), the positional relationship between the band-like portion 522*b* and the band-like portion 524*b* may be flipped. In the semiconductor device A1, the plurality of insulating substrate 43 are respectively arranged on the band-like portion 522*b* and the band-like portion 524*b*, and are over both of these.

The wiring portion 525 is formed on the front surface 411 of the insulating substrate 41. To the wiring portion 525 is, as shown in FIG. 5, the detection terminal 65 is connected. As shown in FIG. 6, on the wiring portion 525, the through hole 525*a* is formed. The through hole 525*a* extends through the wiring portion 525 in the z-direction. In the through hole 525*a*, the metallic member 58 fits.

The plurality of wiring portions 526*b* and 527 are respectively formed on the front surface 411 of the insulating substrate 41. The plurality of wiring portions 526 are respectively formed in a region inside the front surface 411 between two first semiconductor elements 1 adjacent to each other in the x-direction in plan view. The plurality of wiring portions 527 are respectively formed in a region inside the front surface 411 between two second semiconductor elements 2 adjacent to each other in the x-direction in plan view. Although in the illustrated example, each of the wiring portions 526 and 527 has a rectangular shape in plan view (see FIGS. 5 and 6), the present disclosure is not limited to this. The wiring portions 526 may be integrally formed with a wiring portion 512, and each of the plurality of wiring portions 526 and 527 may be integrally formed with the wiring portion 513. In the semiconductor device A1, each of the plurality of wiring portions 526 and 527 is not conducted to either the plurality of first semiconductor elements 1 or the plurality of second semiconductor elements 2.

The plurality of wiring portions 528 are respectively formed on the front surface 411 of the insulating substrate 41. The plurality of wiring portions 528 are respectively formed in the vicinity of a y-directional peripheral edge of the front surface 411. The plurality of wiring portions 528 are arranged on either the y2-directional side when seen from the wiring portion 523, or the y1-directional side when seen from the wiring portions 524 with respect to the y-direction. To each wiring portion 528, as shown in FIG. 5, each lateral terminal 66 is connected. In the semiconductor device A1, each of the wiring portions 528 is not conducted to either of the plurality of first semiconductor elements 1 and the plurality of second semiconductor elements 2.

The plurality of wiring portions 531 are, as shown in FIGS. 9 and 11, respectively formed on the front surfaces 421 of the plurality of insulating substrates 42. Each wiring portion 531 is, as can be seen from FIGS. 5 and 6, conducted to the third electrode 13 (a gate electrode) of the corresponding one of the first semiconductor elements 1 through the corresponding one of the connection members 721. Further, each wiring portion 531 is conducted to the wiring portion 521 via the corresponding one of the connection members 731. Each wiring portion 531 is an example of the "second wiring portion".

The plurality of wiring portions 532 are, as shown in FIGS. 10 and 11, respectively formed on the front surfaces 431 of the plurality of insulating substrates 43. Each wiring portion 532 is, as can be seen from FIGS. 5 and 6, conducted to the sixth electrode 23 (a gate electrode) of the corresponding one of the second semiconductor elements 2 through the corresponding one of the connection members 722. Further, each wiring portion 532 is conducted to the wiring portion 522 through the corresponding one of the connection members 732. Each wiring portion 532 is an example of the "sixth wiring portion".

The plurality of wiring portions 533 are, as shown in FIG. 11, respectively formed on the front surfaces 421 of the plurality of insulating substrates 42. Each wiring portion 533 is, as can be seen from FIGS. 5 and 6, conducted to the second electrode 12 (a source electrode) of the corresponding one of the first semiconductor elements 1 through the corresponding one of the connection members 723. Further, each wiring portion 533 is conducted to the wiring portion 523 through the corresponding one of the connection members 733. Each wiring portion 533 is an example of the "fourth wiring portion".

The plurality of wiring portions 534 are, as shown in FIG. 11, respectively formed on the front surfaces 431 of the plurality of insulating substrates 43. Each wiring portion 534 is, as can be seen from FIGS. 5 and 6, conducted to the fifth electrode 22 (a source electrode) of the corresponding one of the second semiconductor elements 2 through the corresponding one of the connection members 724. Further, each wiring portion 534 is conducted to the wiring portion 524 the corresponding one of the connection members 734. Each wiring portion 534 is an example of the "eighth wiring portion".

The plurality of metallic members 59 respectively extends through the insulating substrate 41 in the z-direction and conduct between the wiring portion 513 and the wiring portion 514, as shown in FIG. 11. Each metallic member 59 is, for example, columnar. In the illustrated example, although the plan-view shape of each metallic member 59 is circular (see FIGS. 5-8), it may be elliptic or polygonal instead of being circular. The constituent material of each metallic member 59 is, for example, copper or copper alloy.

The plurality of metallic members 59 fit, as shown in FIGS. 6-8 and 11, in each through hole 513a of the wiring portions 513 and in each through holes 514b of the wiring portions 514, and are inserted in each through holes 413 of the insulating substrate 41. Each metallic member 59 touches the inner surface of the through hole 513a or the inner surface of the through hole 514b. Each metallic member 59 is supported by its fitting in the through hole 513a or the through hole 514b. Regarding this, in the case where there are gaps between the metallic member 59 and the inner surface of the through hole 513a and between the metallic member 59 and the inner surface of the through hole 514b, solder should be poured into such gaps. According to this configuration, those gaps are filled with the solder, and each metallic member 59 is fixed to the wiring portion 513 and the wiring portion 514. Solder can be filled in gaps between the metallic member 59 and the inner surface of the through holes 413 of the insulating substrate 41 when it is poured therein.

The of metallic member 58 extends through the insulating substrate 41 in the z-direction and conducts between the wiring portion 511 and the wiring portion 525. The metallic member 58 is, for example, columnar. In the illustrated example, although the plan-view shape of each metallic member 58 is circular (see FIGS. 6-8), it may be elliptic or polygonal instead of being circular. The constituent material of each metallic member 58 is, for example, copper or copper alloy.

The metallic member 58 fits, as shown in FIGS. 6-8, in the through hole 525a of the wiring portion 525 or in the through hole 511b of the wiring portion 511, and is inserted in the through hole 414 of the insulating substrate 41. The metallic member 58 touches the inner surface of the through hole 525a, the inner surface of the through hole 511b, and the inner surface of the through hole 414, respectively. The metallic member 58 is supported by its fitting in the through hole 525a, the through hole 511b, and the through hole 414. Regarding this, in the case where there are gaps between the metallic member 58 and the inner surfaces of the through hole 525a, the through hole 511b, or the through hole 414, solder should be poured into such gaps. According to this configuration, those gaps are filled with the solder, and the metallic member 58 is fixed to the wiring portion 511 and 525, and the insulating substrate 41.

In the semiconductor device A1, as shown in FIGS. 12 and 13, each first semiconductor element 1 is accepted in a recess formed by an opening portion 415 of the insulating substrate 41, an opening portion 511a of the wiring portion 511, and the conductive plate 31. In the illustrated example, although the element front surface 1a of each first semiconductor element 1 overlaps, when seen in a direction orthogonal to the z-direction (for example, the y-direction), with either of the insulating substrate 41 or the wiring portion 511, it may be configured that it overlaps with the wiring portion 521. In each of those cases, each first semiconductor element 1 does not extend farther than the wiring portion 521 upwardly in the z-direction (in the z2-direction). Likewise, as shown in FIGS. 12 and 14, each second semiconductor element 2 is accepted in a recess formed by an opening portion 416 of the insulating substrate 41, an opening portion 514a of the wiring portion 514, and the conductive plate 32. In the illustrated example, although the element front surface 2a of each first semiconductor element 2 overlaps, when seen in a direction orthogonal to the z-direction (for example, the y-direction), with either of the insulating substrate 41 or the wiring portion 514, it may be configured that it overlaps with the wiring portion 522. In each of those cases, each second semiconductor element 2 does not extend farther than the wiring portion 522 upwardly in the z-direction (in the z2-direction).

The plurality of control terminals 61 and 62, the plurality of detection terminals 63-65, and the plurality of lateral terminals 66 are respectively made of a conductive material. This conductive material is, for example, copper or copper alloy.

The control terminal 61 is conducted to the third electrode 13 (a gate electrode) of each first semiconductor element 1. To the control terminal 61, the first driving signal for controlling the switching operation of each first semiconductor element 1 is input. The control terminal 61 includes a portion covered by the sealing member 8 and a portion not covered by the sealing member 8. The portion of the control terminal 61 covered by the sealing member 8 is bonded to the pad portion 521a of the wiring portion 521. To the portion of the control terminal 61 not covered by the sealing member 8, an external control device (for example, a gate driver) is connected, and the first driving signal (a gate voltage) is input from the control device. The driving terminal 61 is an example of the "first control terminal".

The control terminal 62 is conducted to the sixth electrode 23 (a gate electrode) of each second semiconductor element 2. To the control terminal 62, the second driving signal for controlling the switching operation of each second semiconductor element 2 is input. The control terminal 62 includes a portion covered by the sealing member 8 and a portion not covered by the sealing member 8. The portion of the control terminal 62 covered by the sealing member 8 is bonded to the pad portion 522a of the wiring portion 522. To the portion of the control terminal 62 not covered by the sealing member 8, the above external control device (for example, a gate driver) is connected, and the second driving signal (a gate voltage) is input from the control device. The control terminal 62 is an example of the "second control terminal".

The detection terminal 63 is conducted to the second electrode 12 (a source electrode) of each first semiconductor element 1. The detection terminal 63 outputs the first detection signal for indicating a conductive state of each first semiconductor element 1. In the semiconductor device A1, as the first detection signal, a voltage applied to the second electrode 12 of each first semiconductor element 1 (a voltage corresponding to a source current) is output from the detection terminal 63. The detection terminal 63 includes a portion covered by the sealing member 8 and a portion not covered by the sealing member 8. The portion of the detection terminal 63 covered by the sealing member 8 is bonded to the pad portion 523a of the wiring portion 523. To the portion of the detection terminal 63 not covered by the sealing member 8, the external control device as above is connected, and the portion of the detection terminal 63 not covered by the sealing member 8 outputs the above first detection signal to the control device. The detection terminal 63 is an example of the "first detection terminal".

The detection terminal 64 is conducted to the fifth electrode 22 (a source electrode) of each second semiconductor element 2. The detection terminal 64 outputs the second detection signal for indicating a conductive state of each second semiconductor element 2. In the semiconductor device A1, as the second detection signal, a voltage applied to the fifth electrode 22 of each second semiconductor element 2 (a voltage corresponding to a source current) is output from the detection terminal 64. The detection terminal 64 includes a portion covered by the sealing member 8 and a portion not covered by the sealing member 8. The portion of the detection terminal 64 covered by the sealing member 8 is bonded to the pad portion 524a of the wiring portion 524. To the portion of the detection terminal 64 not covered by the sealing member 8, the external control device as above is connected, and the portion of the detection terminal 64 not covered by the sealing member 8 outputs the second detection signal to the control device. The detection terminal 64 is an example of the "second detection terminal".

The detection terminal 65 is conducted to the first electrode 11 (a drain electrode) of each first semiconductor element 1. To the detection terminal 65 a voltage applied to the first electrode 11 of each first semiconductor element 1 (a voltage corresponding to a drain current) is output. The detection terminal 65 includes a portion covered by the sealing member 8 and a portion not covered by the sealing member 8. The portion of the detection terminal 65 covered by the sealing member 8 is bonded to the wiring portion 525. To the portion of the detection terminal 65 not covered by the sealing member 8, the external control device as above is connected, and the portion of the detection terminal 65 not covered by the sealing member 8 outputs the voltage applied to the first electrode 11 of each first semiconductor element 1 (a voltage corresponding to a drain current) to the control device.

Each of the plurality of lateral terminal 66 is not conducted to either of the plurality of first semiconductor element 1 and the plurality of second semiconductor element 2. The plurality of lateral terminals 66 respectively include a portion covered by the sealing member 8 and a portion not covered by the sealing member 8. As to each lateral terminal 66, the portion covered by the sealing member 8 is bonded to one of the plurality of wiring portion 528. As to each lateral terminal 66, the portion not covered by the sealing member 8 protrudes from the sealing member 8 in the y-direction. In the illustrated example, although the semiconductor device A1 is provided with the plurality of lateral terminals 66, it does not have to be provided with them. In this case, the semiconductor device A1 does not have to be provided with the plurality of wiring portion 528.

The pluralities of connection members 7 respectively conduct between two parts separated from each other. As described above, the pluralities of connection members 7 include pluralities of connection members 711, 712, 721-724, and 731-734. The pluralities of connection members 7 are, for example, bonding wires. Some of the pluralities of connection members 7 (for example, the pluralities of connection members 711 and 712) may be metallic plates instead of bonding wires. The constituent materials of the pluralities of connection members 7 may be any of gold, aluminum and copper.

The plurality of connection members 711 are, as shown in FIGS. 3 and 5, bonded to the second electrode 12 (a source electrode) of the respective first semiconductor elements 1 and the wiring portion 513, and conduct therebetween. Unlike the illustrated example, the connection members 711 may be bonded to upper surfaces of the plurality of metallic members 59 instead of the wiring portion 513. The connection members 712 are, as shown in FIGS. 4 and 5, bonded to the respective fifth electrodes 22 (source electrodes) of the plurality of second semiconductor elements 2 and the wiring portion 512, and conduct therebetween.

The plurality of connection members 721 are, as shown in FIGS. 3 and 5, bonded to the third electrode 13 (a gate electrode) of each of the plurality of first semiconductor elements 1 and the wiring portion 531, and conduct therebetween. In the illustrated example, each connection member 721 extends in the x-direction from its joint to each third electrode 13 toward its joint to each wiring portion 531 so as to get closer to the control terminal 61 (see FIG. 5). Each connection member 721 is an example of the "second connection member".

The plurality of connection members 722 are, as shown in FIGS. 4 and 5, bonded to the sixth electrode 23 (a gate electrode) of each of the plurality of second semiconductor elements 2 and the wiring portion 532, and conduct therebetween. In the illustrated example, each connection member 722 extends in the x-direction from its joint to each sixth electrode 23 toward its joint to each wiring portion 532 so as to get closer to the control terminal 62 (see FIG. 5). Each connection member 722 is an example of the "sixth connection member".

The plurality of connection members 723 are, as shown in FIGS. 3 and 5, bonded to the second electrode 12 (a source electrode) of each of the plurality of first semiconductor elements 1 and the wiring portion 533, and conduct therebetween. In the illustrated example, each connection member 723 extends in the x-direction from its joint to each second electrode 12 toward its joint to each wiring portion 533 so as to get closer to the detection terminal 63 (see FIG. 5). Each connection member 723 is an example of the "fourth connection member".

The plurality of connection members 724 are, as shown in FIGS. 4 and 5, bonded to the fifth electrode 22 (a source electrode) of each of the plurality of second semiconductor elements 2 and the wiring portion 534, and conduct therebetween. In the illustrated example, each connection member 724 extends in the x-direction from its joint to each fifth electrode 22 toward its joint to each wiring portion 534 so as to get closer to the detection terminal 64 (see FIG. 5). Each connection member 724 is an example of the "eighth connection member".

The plurality of connection members 731 are, as shown in FIGS. 3 and 5, respectively bonded to the respective wiring portions 531 and the band-like portion 521*b* of the wiring portion 521, and conduct the respective wiring portions 531 and the wiring portion 521. In the illustrated example, each connection member 731 extends in the x-direction from its joint to each wiring portion 531 toward its joint to the wiring portion 521 so as to go away from the control terminal 61 (see FIG. 5). Each connection member 731 extends in the x-direction in plan view. Each connection member 731 is an example of the "first connection member".

The plurality of connection members 732 are, as shown in FIGS. 4 and 5, respectively bonded to the respective wiring portions 532 and the band-like portion 522*b* of the wiring portion 522, and conduct the respective wiring portions 532 and the wiring portion 522. In the illustrated example, each connection member 732 extends in the x-direction from its joint to each wiring portion 532 toward its joint to the wiring portion 522 so as to go away from the control terminal 62 (see FIG. 5). Each connection member 732 extends in the x-direction in plan view. Each connection member 732 is an example of the "fifth connection member".

The plurality of connection members 733 are, as shown in FIGS. 3 and 5, respectively bonded to the respective wiring portions 533 and the band-like portion 523*b* of the wiring portion 523, and conduct the respective wiring portions 533 and the wiring portion 523. In the illustrated example, each connection member 733 extends in the x-direction from its joint to each wiring portion 533 toward its joint to the wiring portion 523 so as to go away from the detection terminal 63 (see FIG. 5). Each connection member 733 extends in the x-direction in plan view. Each connection member 733 is an example of the "third connection member".

The plurality of connection members 734 are, as shown in FIGS. 4 and 5, respectively bonded to the respective wiring portions 534 and the band-like portion 524*b* of the wiring portion 524, and conduct the respective wiring portions 534 and the wiring portion 524. In the illustrated example, each connection member 734 extends in the x-direction from its joint to each wiring portion 534 toward its joint to the wiring portion 524 so as to go away from the detection terminal 64 (see FIG. 5). Each connection member 734 extends in the x-direction in plan view. Each connection member 734 is an example of the "seventh connection member".

The sealing member 8 covers the plurality of first semiconductor elements 1, the plurality of second semiconductor elements 2, a part of the supporting member 3, the plurality of insulating substrates 41-43, parts of the pluralities of wiring portions 511-514, the pluralities of wiring portions 521-528, 531-534, parts of the pair of control terminals 61 and 62, parts of the plurality of detection terminals 63-65, parts of the plurality of lateral terminals 66, and the plurality of connection members 7. The sealing member 8 is made of an insulating resin material such as epoxy resin. The sealing member 8 is, as shown in FIG. 5, rectangular in plan view.

The sealing member 8 has, as shown in FIGS. 1, 5, and 9-12, a resin front surface 81, a resin rear surface 81, and a plurality of resin lateral surfaces 831-834. As shown in FIGS. 9-12, the resin front surface 81 and the resin rear surface 82 are separated from each other in the z-direction. The resin front surface 81 faces the z2-direction, and the resin rear surface 82 faces the z1-direction. As shown in FIGS. 5, 9, and 10, the resin lateral surface 831 and the resin lateral surface 832 are separated from each other in the x-direction. The resin lateral surface 831 faces the x1-direction, and the resin lateral surface 832 faces the x2-direction. The pair of control terminals 61 and 62 and the plurality of detection terminals 63-65 respectively protrude from the resin lateral surface 831. As shown in FIGS. 5, 11 and 12, the resin lateral surface 833 and the resin lateral surface 834 are separated from each other in the y-direction. The resin lateral surface 833 faces the y1-direction, and the resin lateral surface 833 faces the y2-direction. The plurality of lateral terminals 66 respectively protrudes from either of the resin lateral surface 833 and the resin lateral surface 834.

The sealing member 8 has cutouts formed on the resin lateral surface 832 starting from the resin front surface 81 and the resin rear surface 82 respectively. Due to the cutouts, as shown in FIGS. 1, 5, 9, and 10, the first power terminal portion 501, the second power terminal portion 502, the third power terminal portion 503, and the fourth power terminal portion 504 are respectively exposed from the sealing member 8.

The working effects of the semiconductor device A1 are as follows.

In the semiconductor device A1, the wiring portion 531 is interposed in the conductive route between the wiring portion 521 to which the control terminal 61 is connected and the third electrode 13 of each first semiconductor element 1. According to this configuration, as compared to the case where the connection member 721 is directly connected to the wiring portion 521, the length of the conductive route from the third electrode 13 to the control terminal 61 is extendable. Therefore, the transmission route of the first driving signal from the control terminal 61 to each first semiconductor element 1 can be made longer, and it is possible to enlarge the inductance component of the transmission route. Due to this, the semiconductor device A1 can suppress oscillation of the first driving signal.

In the semiconductor device A1, the plurality of first semiconductor elements 1 are disposed in in line with the x-direction. Further, the control terminal 61 is arranged on one side in the x-direction with respect to the plurality of first semiconductor elements 1 (in the example of FIG. 5, on the x1-direction side). In this configuration, as to the first semiconductor element 1 that is far-ended on the one side with respect to the x-direction, in the case where the connection member 721 is directly connected to the wiring portion 521 instead of the wiring portion 531, the conduction route from the third electrode 13 of the first semiconductor element 1 to the control terminal 61 tends to be shorter. That is, according to the arrangement of the plurality of first semiconductor elements 1 and the arrangement of the control terminal 61, the oscillation of the above first driving signal is likely to occur. Therefore, as to the above first semiconductor element 1 with which the conductive route becomes shorter, it is effective for suppressing the oscillation of the first driving signal input to this first semiconductor element 1 to interpose the wiring portion 531 in the conductive route between the third electrode 13 and the control terminal 61 to thereby prolong its length.

The semiconductor device A1 is provided with one wiring portion 531 for each first semiconductor element 1, and each first semiconductor 1 is conducted to the wiring portion 521 through the wiring portion 531. According to this configuration, in the conductive route between respective third electrodes 13 of arbitrary two sets of the first semiconductor elements 1, two wiring portions 531 are interposed. Therefore, the route length between arbitrary two sets of the third electrodes 13 can be longer than those in the case where the connection member 721 is directly connected to the wiring portion 521. Therefore, a parasitic resonance can be suppressed which is caused by formation of a loop route going through the first electrode 11 and the third electrode 13 of the respective first semiconductor elements 1 at the time when the plurality of first semiconductor elements are connected parallelly. That is, the semiconductor device A1 can suppress a parasite oscillation which occurs when the plurality of first semiconductor elements 1 are parallelly connected. Note that the parasite oscillation which occurs when the plurality of first semiconductor elements 1 are parallelly connected can also be suppressed by equalizing the conductive route from the first power terminal portion 501 to the first electrodes 11 of the respective first semiconductor elements 1. However, in the case where there is a restriction on a positional relationship of the plurality of first semiconductor elements 1 and the first power terminal portion 501 or in the case where a frequency of the parasite oscillation is high (for example, several hundred MHz), as in the present disclosure, it is favorable to extend the length of conductive route between the respective third electrodes 13 for suppressing the parasite oscillation.

In the semiconductor device A1, the insulating substrate 42 are closer to the control terminal 61 than the respective first semiconductor elements 1 are, when seen in the x-direction. Further, each connection member 731 is configured such that its portion connected to the wiring portion 521 (the band-like portion 521b) is more separated in the x-direction from the control terminal 61 than its portion connected to the wiring portion 531 is. Due to this configuration, as to the semiconductor device A1, lengths of the conductive routes between the third electrode 13 of each first semiconductor elements 1 to the wiring portion 521 (the band-like portion 521b) can be extended. That is, as to the semiconductor device A1, the lengths of the conductive routes between the third electrodes 13 are extended.

The semiconductor device A1 is provided with the connection members 721 and the connection members 731. The connection members 721 conduct the third electrodes 13 of first semiconductor elements 1 and the wiring portions 531, and the connection members 731 conduct the wiring portions 521 and the wiring portions 531. Each of the connection members 721 and 731 is, for example, a bonding wire. Thus, it is easy to adjust a length of each of the connection members 721 and 731. By adjusting lengths of the connection members 721 and 731 to thereby adjust the parasite inductance components of the connection members 721 and 731, the parasite inductance component from the control terminal 61 to the third electrode 13 of each first semiconductor element 1 can be adjusted. As such, according to a variation of characteristics of the respective first semiconductor elements 1, a fine adjustment of the parasite inductance component from the control terminal 61 to the third electrode 13 of each first semiconductor element 1 becomes easy as to the first semiconductor element.

The semiconductor device A1 is provided with one wiring portion 533 for each first semiconductor element 1, and all the first semiconductor elements 1 are conducted to the wiring portions 523 through the wiring portions 533. According to this configuration, two wiring portions 533 are interposed in the conductive route between respective two electrodes 12 of any two of the first semiconductor elements 1, and thus the length of the conductive routes between the two of the first semiconductor elements 1 can be extended. A parasite oscillation that occurs when two or more first semiconductor elements 1 are parallelly connected can occur in a loop route passing the second electrode 12 and the third electrode 13 of each first semiconductor element 1 as well as at a loop route passing the second electrode 12 and the third electrode 13 of each first semiconductor element 1. Therefore, by extending the conductive route between two of the second electrodes 12, the parasite oscillation which occurs when the plurality of first semiconductor elements 1 are parallelly connected can be suppressed.

In the semiconductor device A1, a wiring portion 532 is interposed in the conductive route between the wiring 522 to which the control terminal 62 is connected and the sixth electrode 23 of the second semiconductor element 2. According to this configuration, as compared to the case where the connection member 722 is directly connected to the wiring portion 522, the conductive route from each sixth electrode 23 to the control terminal 62 can be extended. Thus, the transmission route of the second driving signal from the control terminal 62 to the second semiconductor element 2 can be made longer, and therefore the inductance component in the transmission route can be made bigger. Thus, due to this configuration, the semiconductor device A1 can suppress an oscillation of the second driving signal.

In the semiconductor device A1, the plurality of semiconductor elements 2 are aligned in the x-direction. Further, the control terminal is positioned on one side in the x-direction (in the example of FIG. 5, on the x1-direction side) when seen from the plurality of second semiconductor elements 2. In this configuration, when the connection member 722 is directly connected to the wiring portion 522 instead of the wiring portion 532, the second semiconductor element 2 at the outermost end on the one side in the x-direction tend to have a short-length conductive route from the sixth electrode 23 of the above second semiconductor element 2 to the control terminal 62. In other words, depending on the locations of the plurality of second semiconductor elements 2 and the location of the control terminal 62, the oscillation of the second driving signal is likely to occur. As such, with respect to the second semiconductor element 2 which shortens the conductive route as above, it is effective to suppress the oscillation of the second driving signal input to this second semiconductor element 2, to prolong the conductive route from the sixth electrode 23 to the control terminal 62.

The semiconductor device A1 is provided with one wiring portion 532 for each second semiconductor 2, and all the second semiconductor element 2 are conducted to the wiring portion 522 through the wiring portion 532. According to this configuration, in the conductive route between the six electrodes 23 of any two sets of second semiconductor elements 2, two wiring portions 532 are interposed, and thus lengths of conductive routes between sixth electrodes 23 can be extended. Therefore, the parasite oscillation can be suppressed that occurs due to the formation of the loop route going through the fourth electrode 21 and the six electrode 23 of the respective semiconductor elements 2 when they are parallelly connected. That is, the semiconductor device A1 can suppress the parasite oscillation which occurs when the plurality of second semiconductor elements 2 are parallelly connected.

In the semiconductor device A1, each insulating substrate 43 is arranged on the side where the control terminal 62 is located with respect to the x-direction when seen from the respective semiconductor elements 2. Further, the respective connection terminal 732 are located on the side opposite to the side where the control terminal 62 is located with respect to the x-direction when seen from the respective semiconductor elements 2. Thus, in the semiconductor device A1 the conductive routes from the sixth electrode 23 of the respective semiconductor elements 2 to the wiring portion 522 (the band-like portion 522b) can be made longer. Thus, the semiconductor device A1 can prolong the conductive routes between the sixth electrodes 23.

The semiconductor device A1 is provided with the connection members 722 and the connection members 732. The connection members 722 conduct the sixth electrodes 23 of second semiconductor elements 2 and the wiring portions 532, and the connection members 732 conduct the wiring portions 522 and the wiring portions 532. Each of the connection members 722 and 732 is, for example, a bonding wire. Thus, it is easy to adjust a length of each of the connection members 721 and 731. By adjusting lengths of the connection members 722 and 732 and adjusting the parasite inductance components of the connection members 722 and 732, the parasite inductance component from the control terminal 62 to the sixth electrode 23 of each second semiconductor element 2 can be adjusted. As such, according to a variation of characteristics of each second semiconductor element 2, a subtle adjustment of the parasite inductance component from the control terminal 62 to the sixth electrode 23 of each second semiconductor element 2 becomes easy.

The semiconductor device A1 is provided with one wiring portion 534 for each second semiconductor 2, and all the second semiconductor element 2 are conducted to the wiring portion 524 through the wiring portion 534. According to this configuration, in the conductive route between the fifth electrodes 22 of any two sets of second semiconductor elements 2, two wiring portions 534 are interposed, and thus lengths of conductive routes between sixth electrodes 23 can be extended. Therefore, the parasite oscillation can be suppressed that occurs due to the formation of the loop route going through the fourth electrode 21 and the six electrode 23 of the respective semiconductor elements 2 when they are parallelly connected. That is, the semiconductor device A1 can suppress the parasite oscillation which occurs when the plurality of second semiconductor elements 2 are parallelly connected.

In the semiconductor device A1, the wiring portions 531 and 533 are formed on each insulating substrate 42. According to this configuration, the wiring portions 512, 513, and 521-528 formed on the front surface 411 of the insulating substrate 41 and the wiring portions 531 and 533 can be easily separated from each other. Likewise, the wiring portions 532 and 534 are formed on each insulating substrate 43. According to this configuration, the wiring portions 512, 513, and 521-528 formed on the front surface 411 of the insulating substrate 41 and the wiring portions 532 and 534 can be easily separated from each other.

In the semiconductor device A1, each insulating substrate 42 are arranged over the band-like portions 521b and 523b, and it is sufficient to arrange each insulating substrate 42 so that the wiring portion 531 is separated from the wiring portions 521 and 523. For example, the insulating substrates 42 may be arranged on the wiring portions 526, the wiring portion 512, the wiring portions 528 and the like as appropriate, and may be arranged on the front surface 411 of the insulating substrate 41. Likewise, in the semiconductor device A1, each insulating substrate 43 are arranged over the band-like portions 522b and 524b, and it is sufficient to arrange each insulating substrate 43 so that the wiring portion 532 is separated from the wiring portions 522 and 524. For example, the insulating substrates 43 may be arranged on the wiring portions 527, the wiring portion 513, the wiring portions 528 and the like as appropriate, and may be arranged on the front surface 411 of the insulating substrate 41.

Figure 15:
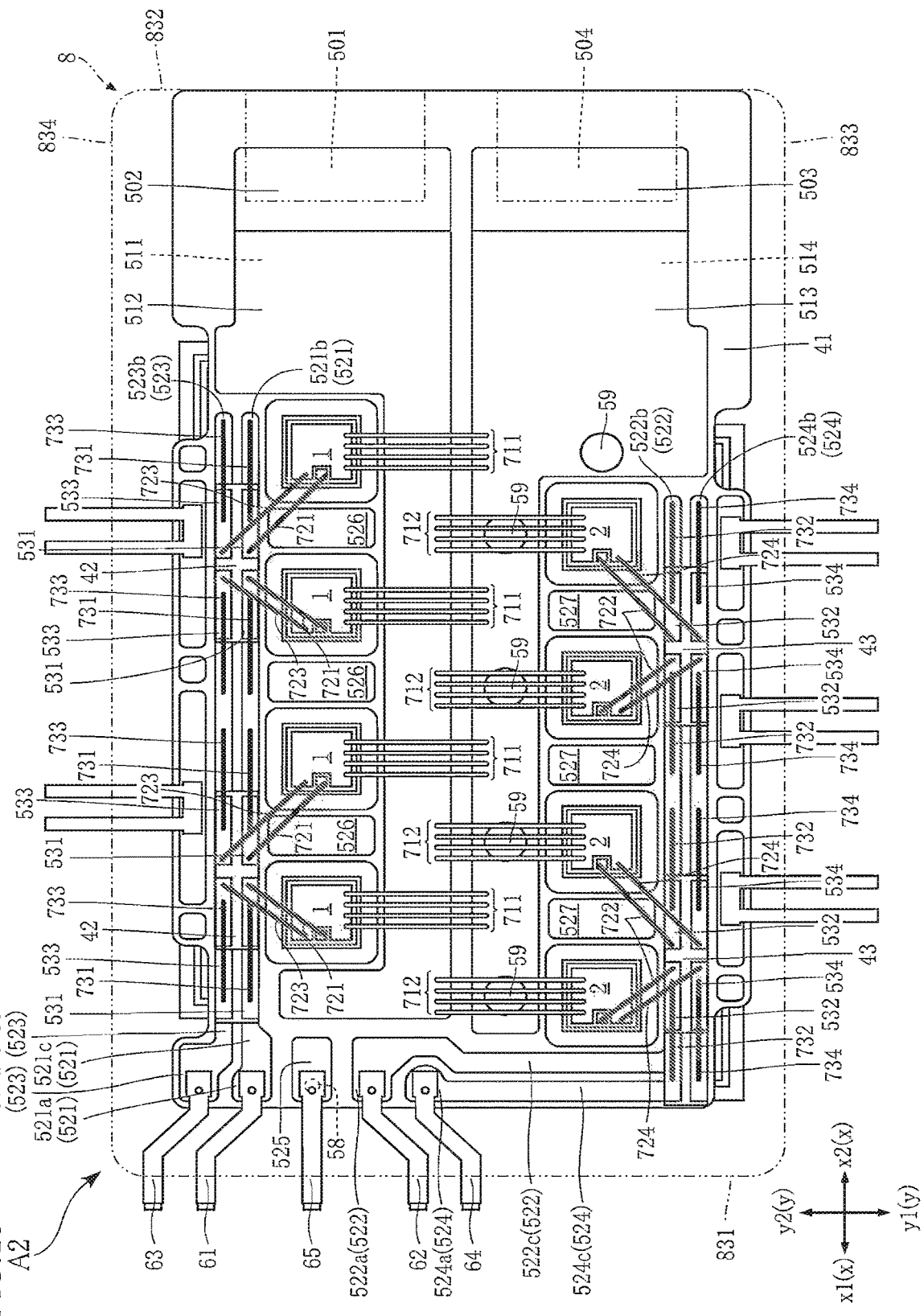
FIG. 15 is a plan view which shows a semiconductor device according to the second embodiment, in which the sealing member is drawn by an imaginary line.

FIG. 15 shows the semiconductor device A2 according to the second embodiment. FIG. 15 is a plan view showing the semiconductor device A2, and draws the sealing member 8 by an imaginary line (a two-dot chain line).

The semiconductor device A1 has the insulating substrates 42 as many as the first semiconductor elements 1. On the other hand, the semiconductor device A2 has the insulating substrates 42 fewer than the first semiconductor elements 1. In the example shown in FIG. 15, there are two insulating substrates 42 while there are four first semiconductor elements 1, and two wiring portions 531 and two wiring portions 533 are formed on one insulating substrate 42. Likewise, the semiconductor device A1 has the insulating substrates 43 as many as the second semiconductor elements 2. On the other hand, the semiconductor device A2 has the insulating substrates 43 fewer than the second semiconductor elements 2 In the example shown in FIG. 15, there are two insulating substrates 43 while there are four second semiconductor elements 2, and two wiring portions 532 and two wiring portions 534 are formed on one insulating substrate 43.

The semiconductor device A2 has the wiring portions 531 as shown in FIG. 15, as the first semiconductor device A1. Therefore, the third electrode 13 of the first semiconductor element 1 is conducted to the wiring portion 521 through the wiring portion 531. According to this configuration, the semiconductor device A2 can suppress the oscillation of the first driving signal. Moreover, according to the configuration same as that of the semiconductor device A1, the semiconductor device A2 exhibits the same effect as that shown by the semiconductor device A1.

Figure 16:
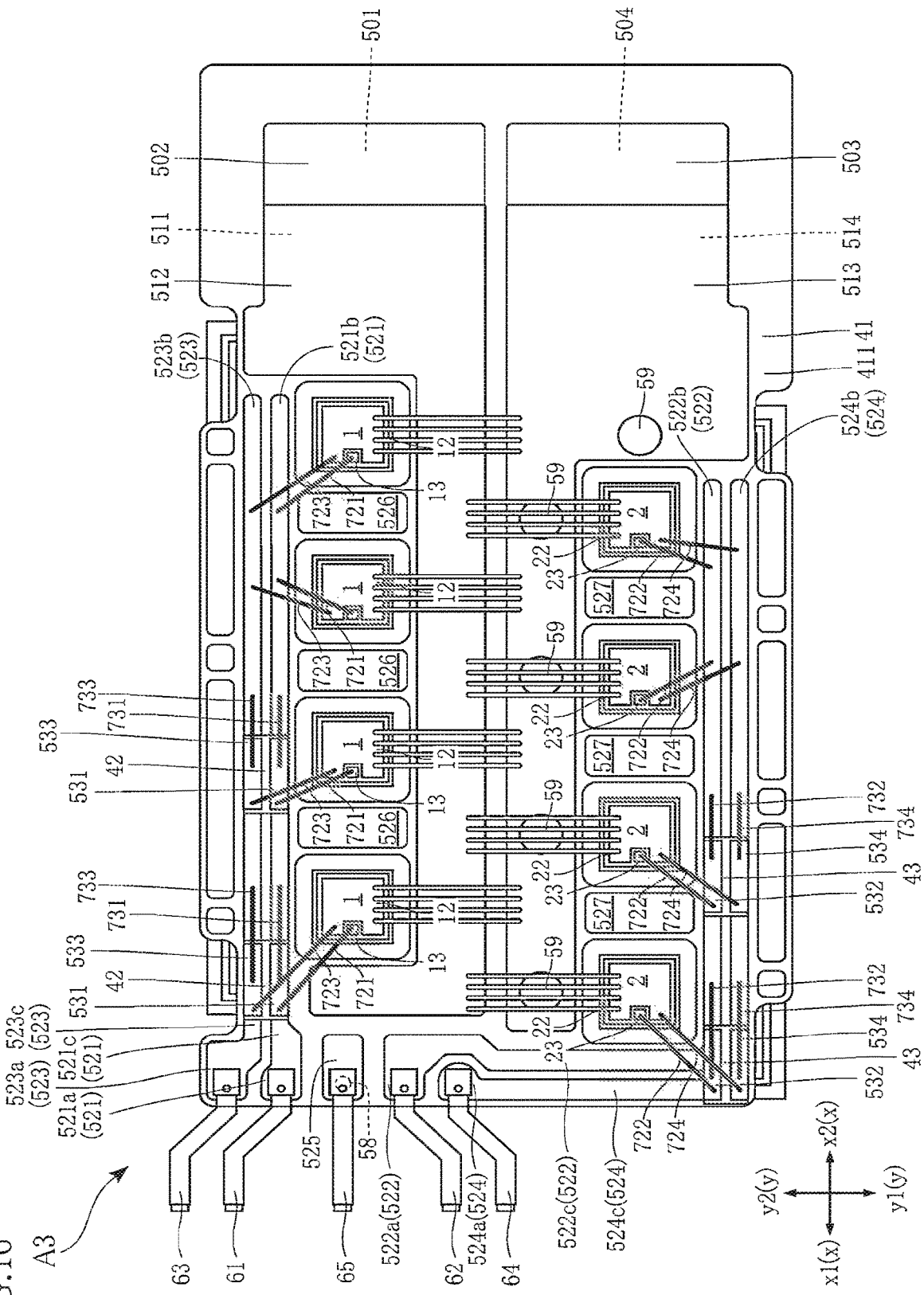
FIG. 16 is a plan view which shows a semiconductor device according to the third embodiment, in which the sealing member is omitted.

FIG. 16 shows the semiconductor device A3 according to the third embodiment. FIG. 16 is a plan view showing the semiconductor device A3, from which the plurality of lateral terminals and the sealing member 8 are omitted.

The semiconductor devices A1 and A2 have the wiring portions 531 as many as the first semiconductor elements 1. On the other hand, the semiconductor device A3 has the wiring portions 531 fewer than the first semiconductor elements 1. In the example shown in FIG. 16, the third electrodes 13 of two of four first semiconductor elements 1 are conducted to the wiring portion 521 through the wiring portions 531, and the third electrodes 13 of the other two of the four first semiconductor elements 1 are conducted to the wiring portion 521, not through the wiring portion 531. As to the former two first semiconductor elements 1, the length of the conductive route to the control terminal 61 is relatively small in the case the connection member 721 is connected directly to the wiring portion 521 rather than to the wiring portion 531, and as to the latter two first semiconductor elements 1, the length of the conductive route to the control terminal 61 is relatively large. Note that the number of the first semiconductor elements 1 and the number of the wiring portions 531 are not limited to the example shown in FIG. 16, and may be varied as appropriate.

Likewise, the semiconductor devices A1 and A2 have the wiring portions 532 as many as the second semiconductor elements 2. On the other hand, the semiconductor device A3 has the wiring portions 532 fewer than the second semiconductor elements 2. In the example shown in FIG. 16, the third electrodes 13 of two of four first semiconductor elements 1 are conducted to the wiring portion 521 through the wiring portions 531, and the third electrodes 13 of the other two of the four first semiconductor elements 1 are conducted to the wiring portion 521, not through the wiring portion 531. As to the former two first semiconductor elements 1, the length of the conductive route to the control terminal 61 is relatively small in the case the connection member 721 is connected directly to the wiring portion 521 rather than to the wiring portion 531, and as to the latter two first semiconductor elements 1, the length of the conductive route to the control terminal 61 is relatively large. Note that the number of the first semiconductor elements 1 and the number of the wiring portions 531 are not limited to the example shown in FIG. 16, and may be varied as appropriate.

The semiconductor device A3 is, as shown in FIG. 16, provided with the wiring portions 531, as the semiconductor device A1. Therefore, the third electrode 13 of the first semiconductor element 1 is conducted to the wiring portion 521 through the wiring portion 531. According to this configuration, the semiconductor device A3 can suppress the oscillation of the first driving signal. Moreover, according to the configuration same as those of the semiconductor devices A1 and A2, the semiconductor device A3 exhibits the same effect as that shown by the semiconductor devices A1 and A2.

As to the semiconductor device A3, among the plurality of first semiconductor elements 1, the ones, whose route to the control terminal 61 is relatively short in the case where the connection member 721 is not connected to the wiring portions 531 but is connected directly to the wiring portions 521, are conducted to the wiring portions 521 through the wiring portions 531. According to this configuration, it becomes possible to lessen the discrepancy of the length difference of the routes from the control terminal 61 to the third terminals 13 of the respective first semiconductor elements 1. As to the plurality of second semiconductor elements 2 as well, it is possible to lessen the discrepancy of the length difference of the routes from the control terminal 62 to the sixth terminals 23 of the respective second semiconductor elements 2.

Figure 17:
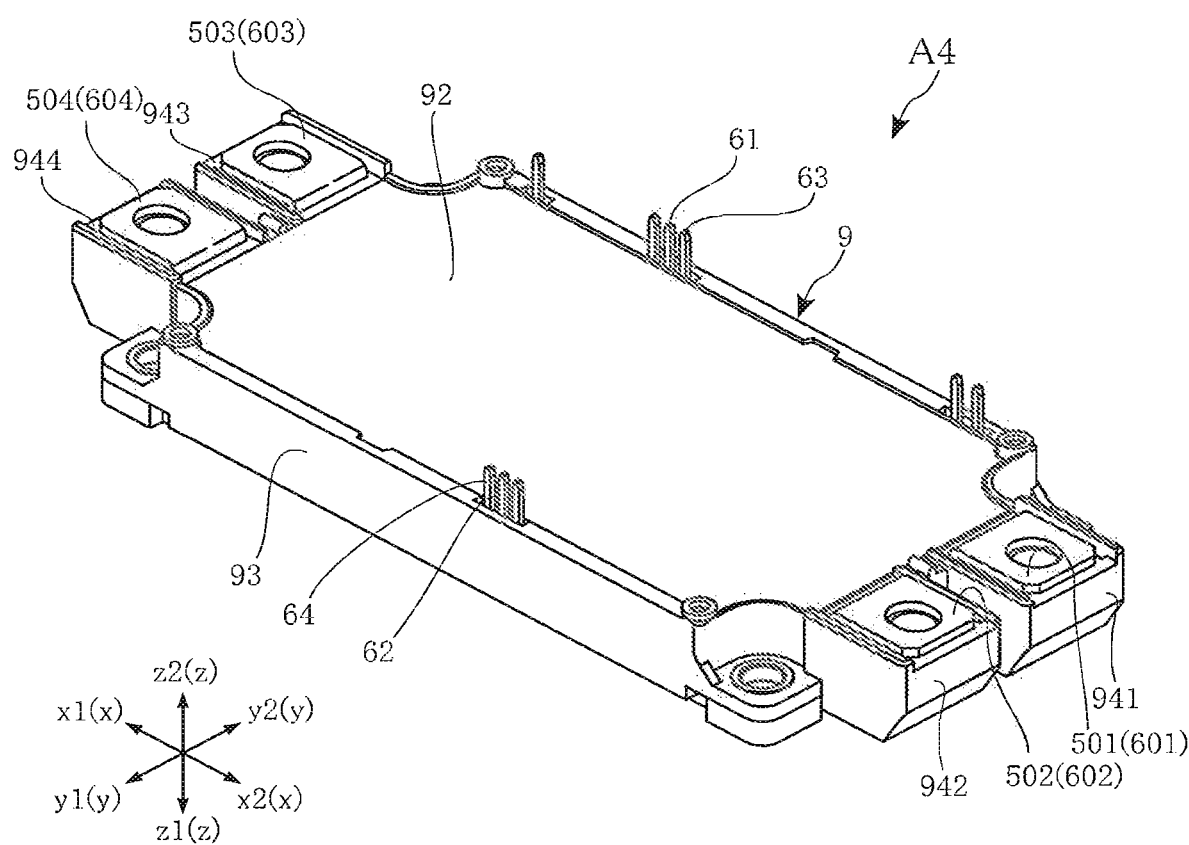
FIG. 17 is a perspective view which shows a semiconductor device according to the fourth embodiment.
Figure 18:
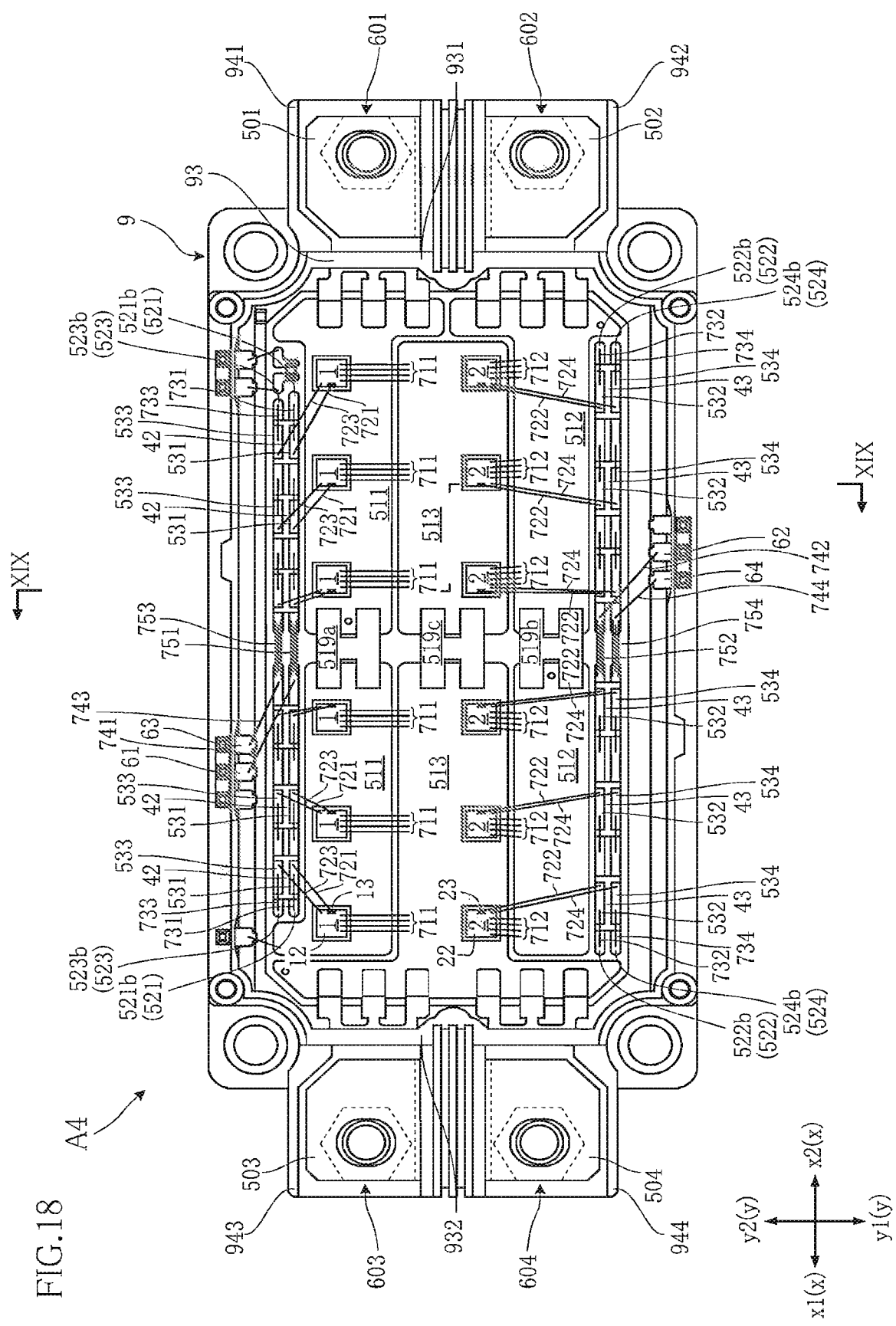
FIG. 18 is a plan view which shows a semiconductor device according to the fourth embodiment, in which a part of a case is omitted.
Figure 19:
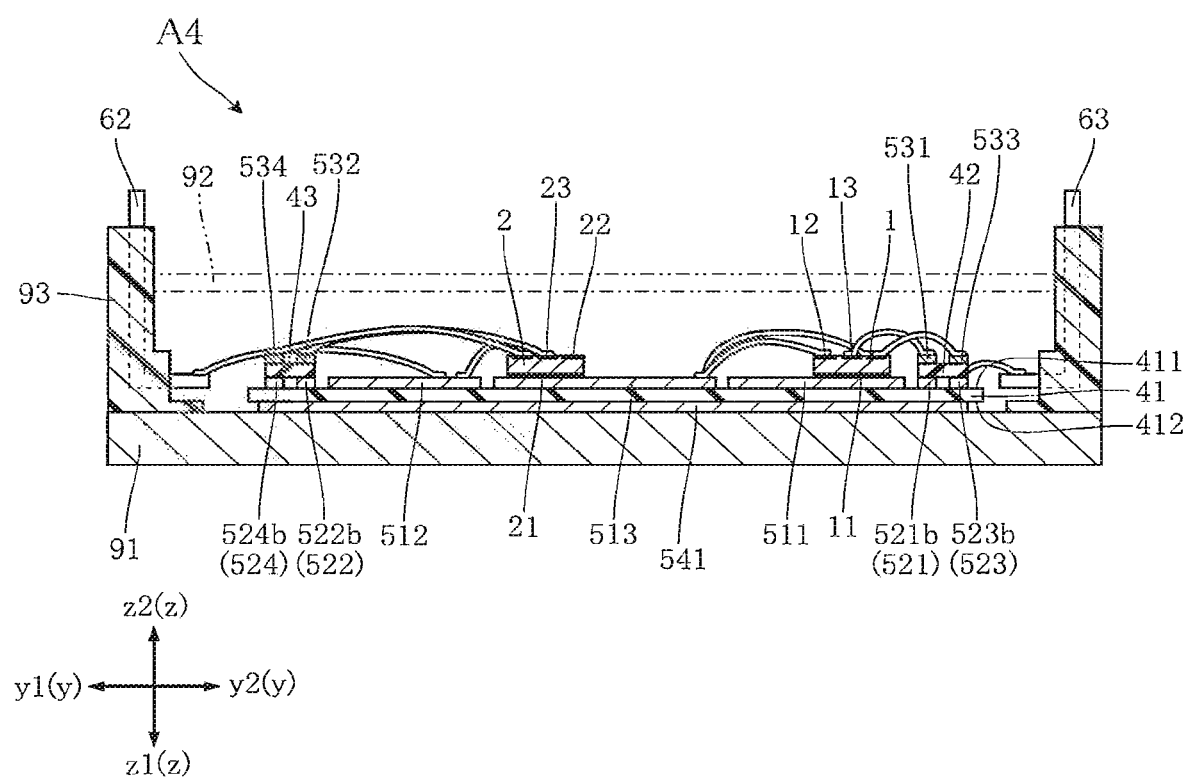
FIG. 19 is a sectional view along XIX-XIX line of FIG. 18, in which a part of the case is drawn by an imaginary line.

FIGS. 17-19 show the semiconductor device A4 according to the fourth embodiment. FIG. 17 is a perspective view showing the semiconductor device A4. FIG. 18 is a plan view showing the semiconductor device A4, from which a part of a case 9 (a top board 92) to be described later is removed. FIG. 19 is a sectional view along XIX-XIX line of FIG. 18, where the top board 92 of the case 9 is drawn by an imaginary line (a two-dot chain line).

As to the semiconductor devices A1-A3, the plurality of first semiconductor elements 1 are mounted on the conductive plate 31, and the plurality of second semiconductor elements 2 are mounted on the conductive plate 43. Meanwhile, as to the semiconductor device A4, the plurality of first semiconductor elements 1 are bonded to the wiring portions 511, and the plurality of second semiconductor elements 2 are bonded to the wiring portions 513. Further, as to the semiconductor devices A1-A3, the first power terminal portion 501 and the second power terminal portion 502 overlap with each other in plan view, and the third power terminal portion 503 and the fourth power terminal portion 504 overlap with each other in plan view. As to the semiconductor device A4, the first power terminal portion 501 and the second power terminal portion 502 are adjacent to each other in plan view, and the third power terminal portion 503 and the fourth power terminal portion 504 are adjacent to each other in plan view.

As shown in FIGS. 17-19, the semiconductor device A4 is provided with the case 9 instead of the sealing member 8. The case 9 is formed to have an approximately rectangular parallelepiped shape, and accommodates the plurality of first semiconductor elements 1, the plurality of second semiconductor elements 2, the plurality of insulating substrates 41-43, the plurality of wiring portions 511-513, 521-524, and 531-534, and so forth. The case 9 is made of synthetic resin that is insulating and has excellent heat resistance, such as PPS (polyphenylene sulfide).

The case 9 is provided with a heat dissipation board 91 as a bottom plate, a frame 93 fixed to the surface of the z2-directional side of the heat dissipation board 91, and the top board 92 fixed to this frame 93. The top board 92 closes the z2-directional side of the frame 93, and is opposed to the heat dissipation board 91 which closes the z1-directional side of the frame 93. Due to the top board 92, the heat dissipation plate 91 and the frame 93, the accommodation space of the above components are defined inside the case 9.

As shown in FIGS. 17 and 18, the case 9 is provided with terminal bases 941-944. These terminal bases 941-944 are integrally formed with the frame 93. The terminal base 941 and the terminal base 942 are connected to the side wall 931 (see FIG. 18) on the x2-directional side of the frame 93. The terminal base 941 and the terminal base 942 are aligned in the y-direction. The terminal base is located on the y2-directional side when seen from the terminal base 942. The terminal base 943 and the terminal base 944 are aligned in the y-direction. The terminal base 943 is located on the y2-directional side when seen from the terminal base 944.

The semiconductor device A4 is, as shown in FIGS. 18 and 19, provided with the plurality of wiring portions 511-513, 521-524, 531-534, and 541. As can be seen from FIGS. 18 and 19, among those wiring portions 511-513, 521-524, 531-534, and 541, two wiring portions 511, two wiring portions 512, two wiring portions 513, the plurality of wiring portions 521-524 are formed on the front surface 411 of the insulating substrate 41. Further, the wiring portion 541 is, as shown in FIG. 19, formed on the rear side 412 of the insulating substrate 41.

The two wiring portions 511 are aligned in the x-direction, and are separated from each other. The two wiring portions 511 are conducted to each other through a connection member 519a. The connection member 519a is a conductive plate material, and is formed of copper or copper alloy. The composing material of the connection member 519a is not limited to copper or copper alloy. The two wiring portions 511 are connected to the first semiconductor elements 1, and are conducted to the first electrode 11 (a drain electrode) of the respective first semiconductor elements 1.

The two wiring portions 512 are aligned in the x-direction, and are separated from each other. The two wiring portions 512 are conducted to each other through a connection member 519b. The connection member 519b is a conductive plate material, and is formed of copper or copper alloy. The composing material of the connection member 519b is not limited to copper or copper alloy. The two wiring portions 512 are conducted to the fifth electrode 22 (a source electrode) of the respective second semiconductor elements 2 through the plurality of connection members 712.

The two wiring portions 513 are aligned in the x-direction, and are separated from each other. The two wiring portions 513 are conducted to each other through a connection member 519c. The connection member 519c is a conductive plate material, and is formed of copper or copper alloy. The composing material of the connection member 519a is not limited to copper or copper alloy. The two wiring portions 513 are conducted to the second electrode 12 (a source electrode) of the first semiconductor elements 1 through the plurality of connection members 711. Further, the two wiring portions 513 are connected the plurality of second semiconductor elements 2, and are conducted to the fourth electrode 21 (a drain electrode) of the respective second semiconductor elements 2.

As shown in FIG. 18, the wiring portion 521 includes two band-like portions 521b. The two band-like portions 521b are aligned in the x-direction, and are separated from each other. The two band-like portions 521b are conducted through the connection member 751. The wiring portion 522 includes two band-like portions 522b that are separated from each other. The two band-like portions 522b are aligned in the x-direction, and are separated from each other. The two band-like portions 522b are conducted through the connection member 752. The wiring portion 523 includes two band-like portions 523b that are separated from each other. The two band-like portions 523b are aligned in the x-direction, and are separated from each other. The two band-like portions 523b are conducted through the connection member 753. The wiring portion 524 includes two band-like portions 524b that are separated from each other. The two band-like portions 524b are aligned in the x-direction, and are separated from each other. The two band-like portions 524b are conducted through the connection member 754. Each of the connection members 751-754 is, for example, a bonding wire. The constituent component of the connection members 751-754 is gold, copper, aluminum, or alloy including some of these.

The wiring portion 541 are formed on almost whole of the rear surface of the insulating substrate 41. Note that a formation range of the wiring portion 541 is not specifically limited. The wiring portion 541 is made of copper or copper alloy. The wiring portion 541 is bonded to the heat dissipation board 91.

The fourth semiconductor device A4 is provided with a first power terminal 601, a second power terminal 602, a third power terminal 603, and a fourth power terminal 604.

The first power terminal 601 is bonded to the wiring portion 511 inside the case 9. Thus, the first power terminal 601 is conducted to the respective first electrodes 11 (drain electrodes) of the plurality of first semiconductor elements 1. The first power terminal 601 includes the first power terminal portion 501. As shown in FIGS. 17 and 18, the first power terminal portion 501 is located on the upper surface (the surface on the z2-directional side) of the terminal base 941.

The second power terminal 602 is bonded to the wiring portion 512 inside the case 9. Thus, the second power terminal 602 is conducted to the respective fifth electrodes 22 (source electrodes) of the plurality of second semiconductor elements 2. The second power terminal 602 includes the second power terminal portion 502. As shown in FIGS. 17 and 18, the second power terminal portion 502 is located on the upper surface (the surface on the z2-directional side) of the terminal base 942.

The third power terminal 603 and the fourth power terminal 604 are bonded to the wiring portion 513 inside the case 9. Thus, the third power terminal 603 and fourth power terminal 604 are conducted to the respective second electrodes 12 (source electrodes) of the plurality of first semiconductor elements 1 and the respective fourth electrodes 21 (drain electrodes) of the plurality of second semiconductor elements 2. The third power terminal 603 includes the third power terminal portion 503. As shown in FIGS. 17 and 18, the third power terminal portion 503 is located on the upper surface (the surface on the z2-directional side) of the terminal base 943. The fourth power terminal 604 includes the fourth power terminal portion 504. As shown in FIGS. 17 and 18, the fourth power terminal portion 504 is located on the upper surface (the surface on the z2-directional side) of the terminal base 944.

In the semiconductor device A4, the control terminal 61 is not bonded to the wiring portion 521, but is conducted to the wiring portion 521 through the connection member 741 inside the case 9. The control terminal 62 is not bonded to the wiring portion 522, but is conducted to the wiring portion 522 through the connection member 742 inside the case 9. the control terminal 61 is not bonded to the wiring portion 521, but is conducted to the wiring portion 521 through the connection member 741 inside the case 9. The control terminal 63 is not bonded to the wiring portion 523, but is conducted to the wiring portion 523 through the connection member 743 inside the case 9. The control terminal 64 is not bonded to the wiring portion 524, but is conducted to the wiring portion 524 through the connection member 744 inside the case 9. Each of the connection members 741-744 is, for example, a bonding wire. The constituent component of the connection members 741-744 is gold, copper, aluminum, or alloy including some of these.

The semiconductor device A4 is provided with, as shown in FIGS. 18 and 19, the wiring portion 531, as the semiconductor device A1. Therefore, the third electrode 13 of the first semiconductor element 1 is conducted to the wiring portion 521 through the wiring portion 531. Due to this configuration, the semiconductor device A4 can suppress the oscillation of the first driving signal, as the semiconductor device A1. Moreover, according to the configuration same as those of the semiconductor devices A1-A3, the semiconductor device A4 exhibits the same effect as that shown by the semiconductor device A1-A3.

Figure 20:
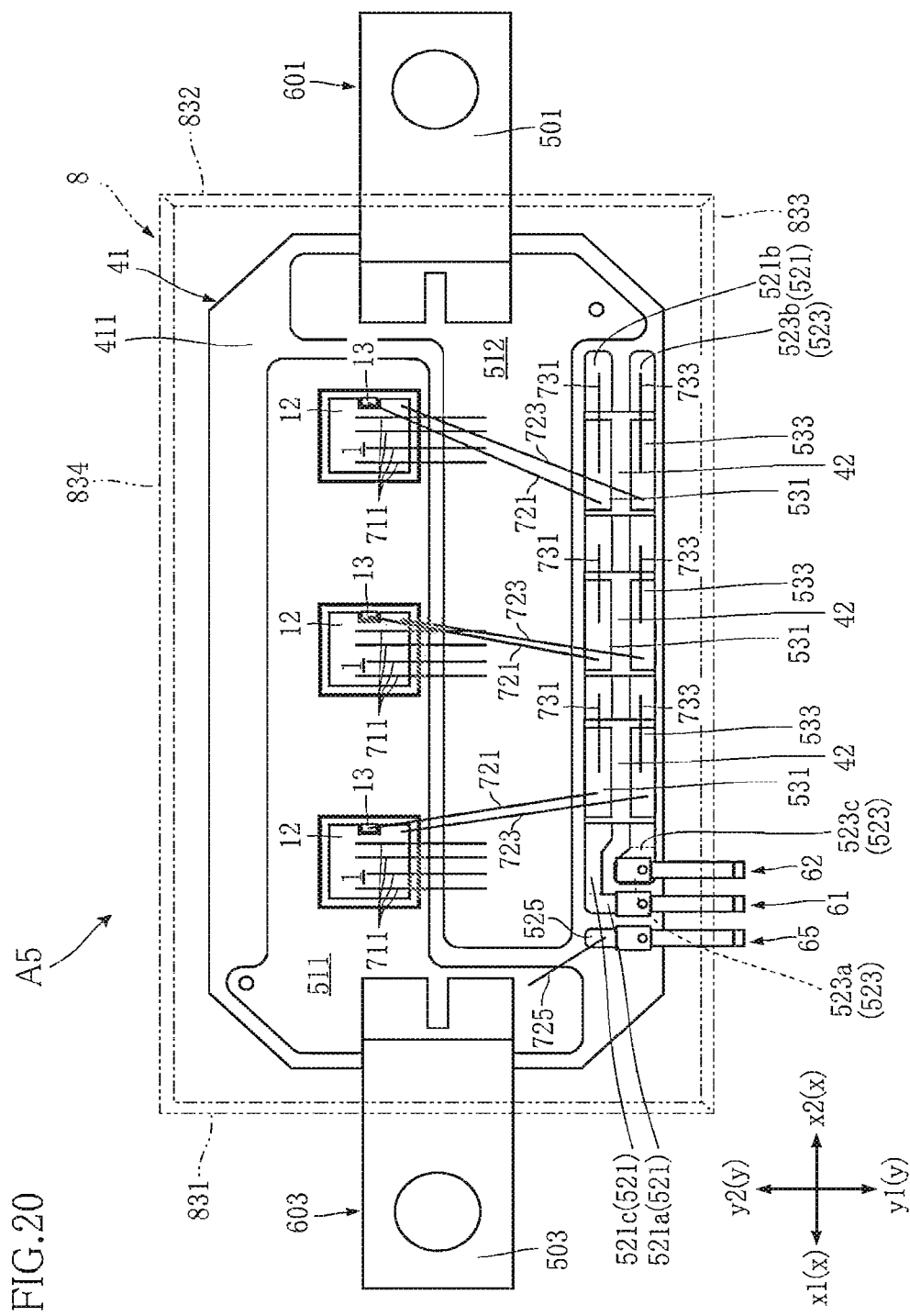
FIG. 20 is a plan view which shows the semiconductor device according to the fifth embodiment, in which the sealing member is drawn by an imaginary line.

FIG. 20 shows the semiconductor device A5 according to the fifth embodiment. FIG. 20 is a plan view showing the semiconductor device A5, and draws the sealing member 8 by an imaginary line (a two-dot chain line).

The semiconductor devices A1-A4 are provided with the plurality of first semiconductor elements 1 and the plurality of second semiconductor elements 2. Meanwhile, the semiconductor device A5 is provided with the plurality of first semiconductor elements 1, but is not provided with even a single second semiconductor element 2.

As shown in FIG. 20, also in the semiconductor device 5, the respective first semiconductor elements 1 are bonded to the wiring portion 511. As the semiconductor device A5 is not provided with the plurality of semiconductor elements 2, it has wiring portions fewer than those the semiconductor devices A1-A4 have. In the semiconductor device A5, the wiring portion 524 is conducted to the wiring portion 511, and thus is conducted to the first electrode 11 (a drain electrode) of the respective first semiconductor elements 1.

The semiconductor device A5 is, as shown in FIG. 20, provided with the wiring portions 531, as the semiconductor device A1. Therefore, the third electrode 13 of the first semiconductor element 1 is conducted to the wiring portion 521 through the wiring portion 531. According to this configuration, the semiconductor device A5 can suppress the oscillation of the first driving signal. Moreover, according to the configuration same as those of the semiconductor devices A1-A4, the semiconductor device A5 exhibits the same effect as that shown by the semiconductor devices A1-A4.

The configuration not provided with even a single second semiconductor element 2, as explained with reference to FIG. 20, is not limited to the configuration of the semiconductor device A5, and can be applied to each of the semiconductor devices A1-A4 as appropriate.

Figure 21:
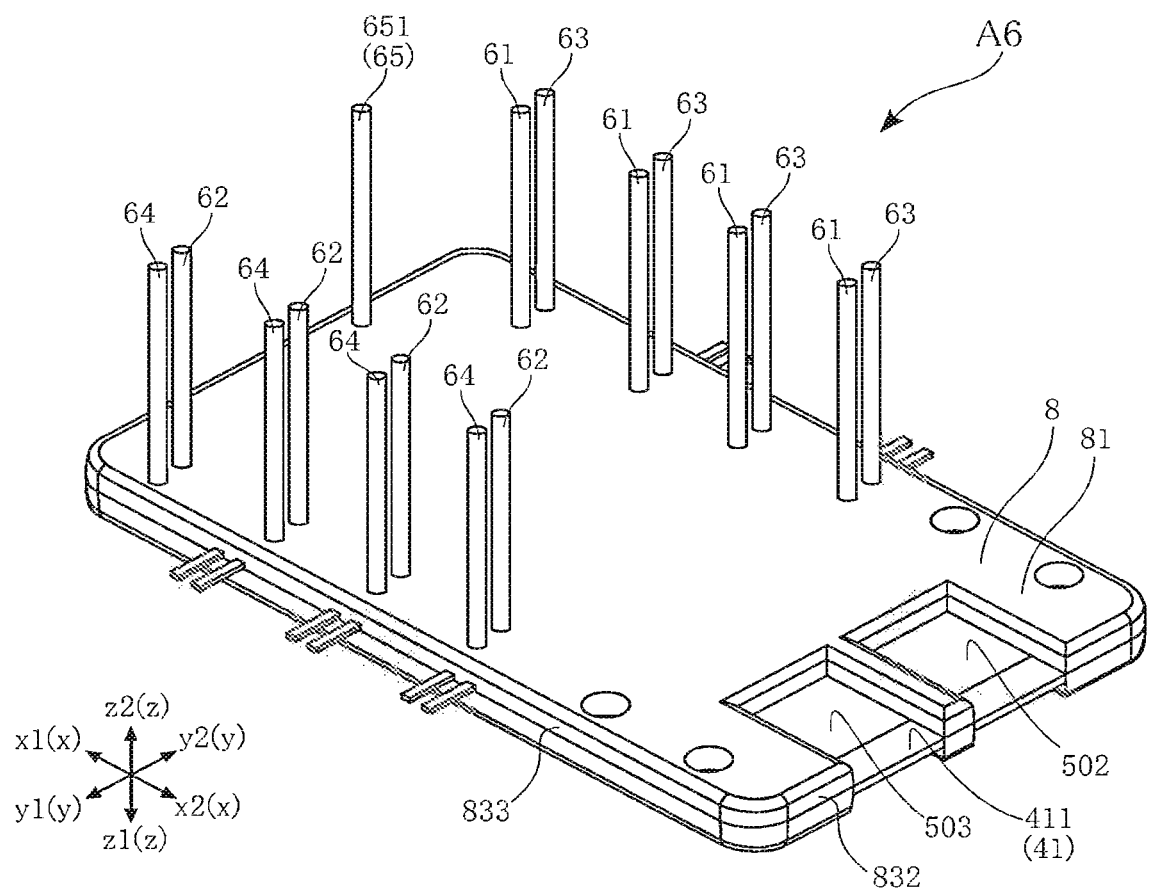
FIG. 21 is a perspective view which shows a semiconductor device according to the sixth embodiment.
Figure 22:
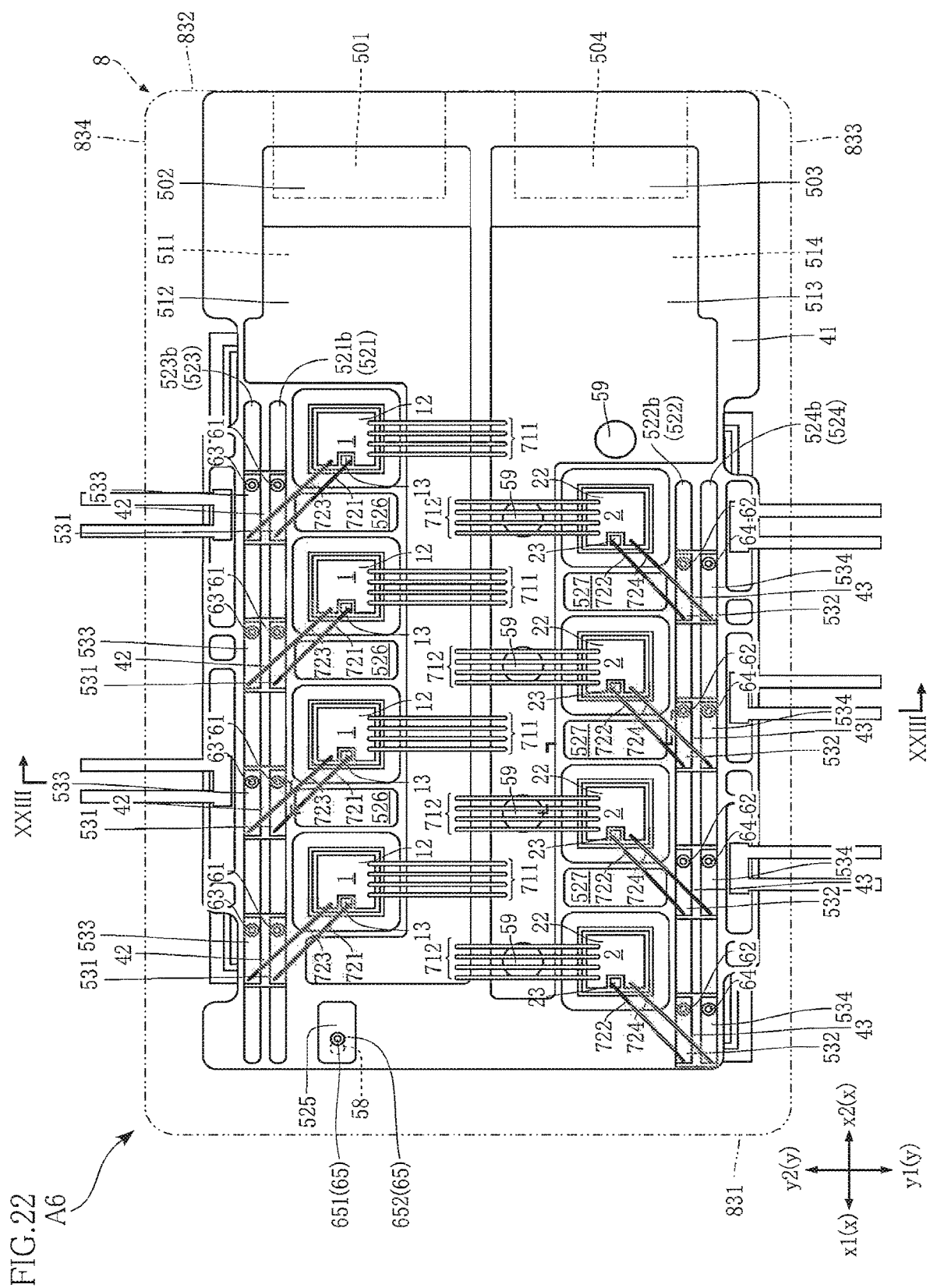
FIG. 22 is a plan view which shows the semiconductor device according to the sixth embodiment, in which the sealing member is drawn by an imaginary line.
Figure 23:
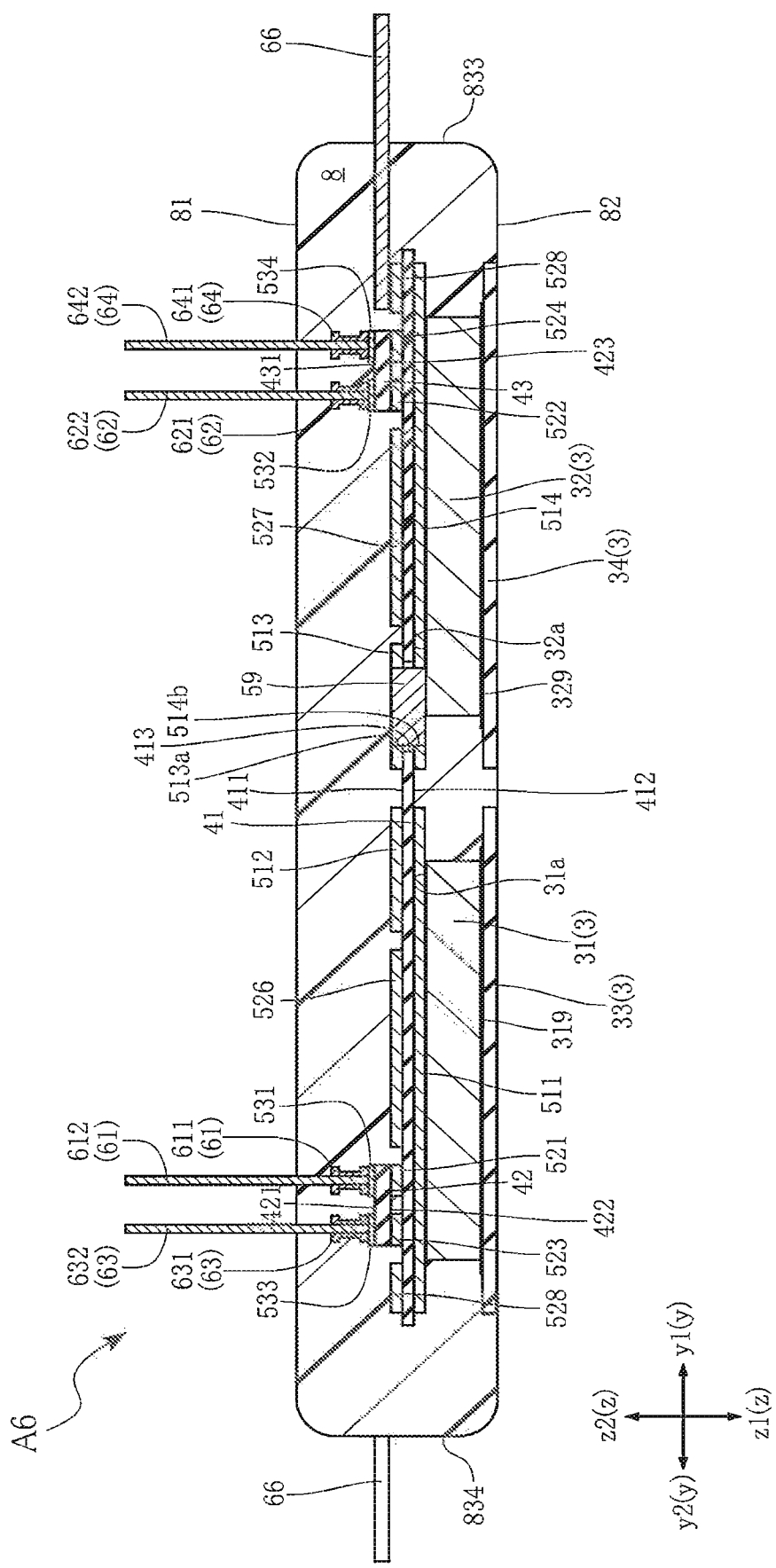
FIG. 23 is a sectional view along XXIII-XXIII line of FIG. 22.

FIGS. 21-23 show the semiconductor device A6 according to the sixth embodiment. FIG. 21 is a perspective view showing the semiconductor device A6. FIG. 22 is a plan view showing the semiconductor device A6, and draws the sealing member 8 by an imaginary line (a two-dot chain line). FIG. 23 is a sectional view along XXIII-XXIII line of FIG. 22.

The semiconductor device A6 is provided with, as shown in FIGS. 21-23, the plurality of first semiconductor elements 1, the plurality of second semiconductor elements 2, the supporting member 3, the plurality of insulating substrates 41-43, the plurality of wring portions 511-514, 521-528 and 531-534, the plurality of metallic members (conductive metallic members) 58 and 59, the plurality of control terminals 61, the plurality of control terminals 62, the plurality of detection terminals 63, the plurality of lateral terminals 66, the plurality of connection members 7, and the sealing member 8. The plurality of connection members 7 include a plurality of connection members 711, 712, and 721-724, as shown in FIG. 22. As to the semiconductor device A6, each first semiconductor element 1 is an example of the "semiconductor element". Further, each control terminal 61 (62) is an example of the "control terminal", and each wiring portion 521 (522) is an example of the "wiring portion". Further, each connection member 721 (722) is an example of the "connection member", and the insulating substrate 42 (43) is an example of the "insulating substrate".

As to the semiconductor devices A1-A5, the first driving signal is input to the respective first semiconductor elements 1 from the common control terminal 61. Meanwhile, the semiconductor device A6 is provided with one control terminal 61 for each of the plurality of first semiconductor elements 1. Likewise, as to the semiconductor devices A1-A5, the first driving signal is input to the respective first semiconductor elements 1 from the common control terminal 61. Meanwhile, the semiconductor device A6 is provided with one control terminal 62 for each of the plurality of second semiconductor elements 2.

As to the semiconductor devices A1-A5, the first detection signal is output to the respective first semiconductor elements 1 from the common detection terminal 63. Meanwhile, the semiconductor device A6 is provided with one detection terminal 63 for each of the plurality of first semiconductor elements 1. Likewise, as to the semiconductor devices A1-A5, the second detection signal is output to the respective second semiconductor elements 2 from the common detection terminal 64. Meanwhile, the semiconductor device A6 is provided with one detection terminal 64 for each of the plurality of second semiconductor elements 2.

As shown in FIG. 23, each of the plurality of control terminals 61 includes a holder 611 and a metallic pin 612. The holder 611 is made of a conductive material. The holder 611 is cylindrical. The holder 611 is bonded to the wiring portion 531. The metallic pin 612 is pressed into the holder 611, and extends in the z-direction. The metallic pin 612 protrudes from the resin front surface 81 of the sealing member 8 upward in the z-direction, and is partially exposed from the sealing member 8.

As shown in FIGS. 21-23, each of the plurality of control terminals 62 includes a holder 621 and a metallic pin 622. Each of the plurality of control terminals 63 includes a holder 631 and a metallic pin 632. Each of the plurality of control terminals 64 includes a holder 641 and a metallic pin 642. Each of the plurality of control terminals 65 includes a holder 651 and a metallic pin 652. Each of the holders 621, 631, 641, and 651 is configured as the holder 611. Note that the holders 621 are respectively connected to the wiring portions 532, the holders 631 are respectively connected to the wiring portions 533, the holders 641 are respectively connected to the wiring portions 534, and the holders 651 are respectively connected to the wiring portions 525. Each of the metallic pins 622, 632, 642, and 652 is configured as the metallic pin 612.

In the illustrated example, as the above semiconductor devices A1-A3, the semiconductor device A6 is configured that the wiring portions 521 and 523 are formed on the front surface 411 of the insulating substrate 41 (see FIGS. 22 and 23), but it is fine not to form the wiring portions 521 and 523 necessarily. In such a case, the respective insulating substrates 42 may be arranged on the front surface 411 of the insulating substrate 41, and it is fine not to have the insulating substrates 42 and the respective wiring portions 531 and the respective wiring portions 533 are formed directly on the front surface 411 of the insulating substrate 41. Likewise, as the above semiconductor devices A1-A3, the semiconductor device A6 is configured that the wiring portions 522 and 524 are formed on the front surface 411 of the insulating substrate 41, but it is fine not to form the wiring portions 522 and 524 necessarily. In such a case, the respective insulating substrates 43 may be arranged on the front surface 411 of the insulating substrate 41, and it is fine not to have the insulating substrates 43 and the respective wiring portions 532 and the respective wiring portions 534 are formed directly on the front surface 411 of the insulating substrate 41.

The semiconductor device A6 is provided with the plurality of control terminals 61. One control terminal 61 is attached to the third electrode 13 of each of the plurality of first semiconductor elements 1. According to this configuration, it becomes possible to input the first driving signal separately to each of the plurality of first semiconductor elements 1 from the control device, when the control device is connected to the semiconductor device A6. According to this, as to the semiconductor device A6, it becomes possible to prolong the transmission route of the first driving signal on the control device side to thereby suppress the oscillation of the first driving signal. Likewise, the semiconductor device A6 is provided with the plurality of control terminals 62. One control terminal 62 is attached to the sixth electrode 23 of each of the plurality of second semiconductor elements 2. According to this configuration, it becomes possible to input the second driving signal separately to each of the plurality of second semiconductor elements 2 from the control device when the control device is connected to the semiconductor device A6. According to this, as to the semiconductor device A6, it becomes possible to prolong the transmission route of the second driving signal on the control device side to thereby suppress the oscillation of the second driving signal.

The semiconductor device A6 is provided with the plurality of control terminals 63. One control terminal 63 is attached to the second electrode 12 of each of the plurality of first semiconductor elements 1. According to this configuration, it becomes possible to output the first detection signal with respect to the control device, separately to each of the plurality of first semiconductor elements 1, when the control device is connected to the semiconductor device A6. According to this, the semiconductor device A6 can have the control device confirm the conduction state of each of the first semiconductor elements 1 one by one. Likewise, the semiconductor device A6 is provided with the plurality of control terminals 64. One control terminal 64 is attached to the fifth electrode 22 of each of the plurality of second semiconductor elements 2. According to this configuration, it becomes possible to output the second detection signal with respect to the control device, separately to each of the plurality of second semiconductor elements 2, when the control device is connected to the semiconductor device A6. According to this, the semiconductor device A6 can have the control device confirm the conduction state of each of the second semiconductor elements 2 one by one.

The semiconductor device according to the present disclosure is not limited to the above embodiments. Design changes can be freely applied to the specific configuration of each portion of the semiconductor device of the present disclosure. For example, the present disclosure includes the embodiments presented in the clauses as below.

Clause 1.
A semiconductor device comprising:
a plurality of first semiconductor elements, each of which has a first electrode, a second electrode, and a third electrode, and is subjected to an ON-OFF control between the first electrode and the second electrode in accordance with a first driving signal input to the third electrode;
a first control terminal to which the first driving signal is input;
a first wiring portion to which the first control terminal is connected;
at least one second wiring portion separated from the first wiring portion;
at least one first connection member to conduct the first wiring portion and the second wiring portion; and
at least one second connection member to conduct the second wiring portion and the third electrode of one of the plurality of first semiconductor elements, wherein
respective first electrodes of the plurality of first semiconductor elements are electrically connected to one another, and respective second electrodes of the plurality of first semiconductor elements are electrically connected to one another.

Clause 2.
The semiconductor device according to Clause 1, wherein
the at least one second wiring portion comprises a plurality of second wiring portions,
the at least one first connection member comprises a plurality of first connection members,
the at least one second connection member comprises a plurality of second connection members,
the plurality of second wiring portions are separated from one another,
the plurality of first connection members are connected to the first wiring portion, and are connected to the plurality of second wiring portions respectively, and
the plurality of second connection members are connected to the plurality of second wiring portions respectively, and are connected to the third electrode of each of the plurality of first electrodes respectively.

Clause 3.
The semiconductor device according to Clause 2, further comprising a first insulating substrate having a first front surface and a first rear surface separated from each other in a thickness direction,
wherein the first wiring portion is formed on the first front surface.

Clause 4.
The semiconductor device according to Clause 3, further comprising at least one second insulating substrate, each of which has a second front surface and a second rear surface separated from each other in the thickness direction, wherein
the second rear surface is opposed to the first front surface, and
at least one of the plurality of second wiring portion is formed on the second front surface.

Clause 5.
The semiconductor device according to Clause 4, wherein
the at least one second insulating substrate comprises a plurality of second insulating substrates; and
the plurality of second insulating substrates are respectively formed on the second front surface of each of the plurality of second insulating substrates.

Clause 6.
The semiconductor device according to Clause 5, wherein
the plurality of first semiconductor elements are disposed in line with a first direction orthogonal to the thickness direction,
the first wiring portion comprises a first band-like portion which extends in the first direction, and
the first band-like portion on one side with respect to a second direction orthogonal to both the thickness direction and the first direction when seen from the plurality of first semiconductor elements.

Clause 7.
The semiconductor device according to Clause 6, further comprising:
a first detection terminal for detecting a conduction state of the second electrode of each of the plurality of first semiconductor elements;
a third wiring portion to which the first detection terminal is connected;
a plurality of fourth wiring portions which are separated from one another and each of which is separated from the third wiring portion;
a plurality of third connection members which respectively conduct the plurality of fourth wiring portions to the third wiring portion; and
a plurality of fourth connection members which respectively conduct the plurality of fourth wiring portions to the second electrode of each of the plurality of first semiconductor elements.

Clause 8.
  The semiconductor device according to Clause 7, wherein
    the third wiring portion comprises a second band-like portion which extends in the first direction,
    the first band-like portion and the second band-like portion have longitudinal directions which are parallel to each other, and
    each of the plurality of the second insulating substrates is over both the first band-like portion and the second band-like portion.

Clause 9.
  The semiconductor device according to Clause 6 or Clause 8, further comprising:
    a plurality of second semiconductor elements, each of which has a fourth electrode, a fifth electrode, and a sixth electrode, and is subjected to an ON-OFF control between the fourth electrode and the fifth electrode in accordance with a second driving signal input to the sixth electrode;
    a second control terminal to which the second driving signal is input;
    a fifth wiring portion to which the second control terminal is connected;
    at least one sixth wiring portion separated from the fifth wiring portion;
    at least one fifth connection member to conduct the fifth wiring portion and the sixth wiring portion; and
    at least one sixth connection member to conduct the sixth wiring portion and the sixth electrode of one of the plurality of second semiconductor elements, wherein
    the respective fourth electrodes of the plurality of second semiconductor elements are electrically connected to one another, and the fifth electrodes of the plurality of second semiconductor elements are electrically connected to one another, and
    the respective second electrodes of the plurality of first semiconductor elements are electrically connected to the fourth electrodes of the plurality of second semiconductor elements respectively.

Clause 10.
  The semiconductor device according to Clause 9, wherein
    the at least one sixth wiring portion comprises a plurality of sixth wiring portions,
    the at least one fifth connection member comprises a plurality of fifth connection members,
    the at least one sixth connection member comprises a plurality of sixth connection members,
    the plurality of sixth wiring portions are separated from one another,
    the plurality of fifth connection members are connected to the fifth wiring portion, and are connected to the plurality of sixth wiring portions respectively, and
    the plurality of sixth connection members are connected to the plurality of sixth wiring portions respectively, and are connected to the sixth electrode of each of the plurality of second electrodes respectively.

Clause 11.
  The semiconductor device according to Clause 10, further comprising at least one third insulating substrate, each of which has a third front surface and a third rear surface separated from each other in the thickness direction, wherein
    the third rear surface is opposed to the first front surface, and
    at least one of the plurality of sixth wiring portions is formed on the third front surface.

Clause 12.
  The semiconductor device according to Clause 11, wherein
    the at least one third insulating substrate comprises a plurality of third insulating substrates,
    the plurality of sixth wiring portions are formed on the third front surface of each of the plurality of third insulating substrate respectively.

Clause 13.
  The semiconductor device according to Clause 12, wherein
    the plurality of second semiconductor elements are disposed in line with the first direction, and are positioned on a side opposite with respect to the second direction to a side where the first band-like portion is positioned when seen from the plurality of first semiconductor elements,
    the fifth wiring portion comprises a third band-like portion which extends in the first direction, and
    the third band-like portion is positioned on one side with respect to the second direction when seen from the plurality of second semiconductor elements.

Clause 14.
  The semiconductor device according to Clause 13, further comprising:
    a second detection terminal for detecting a conduction state of the fifth electrode of each of the plurality of second semiconductor elements;
    a seventh wiring portion to which the second detection terminal is connected;
    a plurality of eighth wiring portions which are separated from one another and each of which is separated from the seventh wiring portion;
    a plurality of seventh connection members which respectively conduct the plurality of eighth wiring portions to the seventh wiring portion; and
    a plurality of eighth connection members which respectively conduct the plurality of eighth wiring portions to the fifth electrode of each of the plurality of second semiconductor elements.

Clause 15.
  The semiconductor device according to Clause 14, wherein
    the seventh wiring portion comprises a fourth band-like portion which extends in the first direction,
    the third band-like portion and the fourth band-like portion have longitudinal directions which are parallel to each other, and
    each of the plurality of the third insulating substrates is over both the third band-like portion and the fourth band-like portion.

Clause 16.
  The semiconductor device according to Clause 13 or Clause 15, wherein
    each of the plurality of first semiconductor elements has a first element front surface and a first element rear surface, and on each of the plurality of first semiconductor elements, the first electrode is formed on the first element rear surface, and the second electrode and the third electrode are formed on the first element front surface, and
    each of the plurality of second semiconductor elements has a second element front surface and a second element rear surface, and on each of the plurality of second semiconductor elements, the fourth electrode is formed on the second element rear surface, and the fifth electrode and the sixth electrode are formed on the second element front surface.

Clause 17

The semiconductor device according to Clause 16, further comprising;
- a first mounting portion on which the plurality of first semiconductor elements are mounted; and
- a second mounting portion on which the plurality of second semiconductor elements are mounted, wherein
- the first mounting portion and the second mounting portion are respectively made of a conductive material, and are separated from each other,
- the respective first electrodes of the plurality of first semiconductor elements are conducted to one another through the first mounting portion, and
- the respective fourth electrodes of the plurality of second semiconductor elements are conducted to one another through the second mounting portion.

Clause 18.

The semiconductor device according to Clause 17, wherein
- the first mounting portion and the second mounting portion are opposed to the first rear surface,
- the first insulating substrate comprises a plurality of first opening portions and a plurality of second opening portions, each of which extends in the thickness direction from the first front surface to the first rear surface,
- the plurality of first opening portions surround each of the plurality of first semiconductor elements when seen in the thickness direction, and
- the plurality of second opening portions surround each of the plurality of second semiconductor elements when seen in the thickness direction.

Clause 19.

The semiconductor device according to Clause 9 or Clause 18, further comprising:
- a first power terminal portion conducted to the first electrode of each of the plurality of first semiconductor elements;
- a second power terminal portion conducted to the fifth electrode of each of the plurality of second semiconductor elements; and
- a third power terminal portion conducted to the second electrode of each of the plurality of first semiconductor elements and the fourth electrode of each of the plurality of second semiconductor elements, wherein
- a direct current voltage is applied between the first power terminal portion and the second power terminal portion,
- the direct current voltage is converted to an alternate current voltage by an ON-OFF control of the plurality of first semiconductor elements and the plurality of second semiconductor elements, and
- the alternate current voltage is output from the third power terminal portion.

Clause 20.

A semiconductor device comprising:
- a plurality of semiconductor elements, each of which has a first electrode, a second electrode, and a third electrode, and is subjected to an ON-OFF control between the first electrode and the second electrode in accordance with a driving signal input to the third electrode;
- a plurality of control terminals to each of which the driving signal is input;
- a plurality of wiring portions which are conducted to the plurality of control terminals and to which the plurality of control terminals are bonded;
- the plurality of connection members which connect the third electrode of each of the plurality of semiconductor elements and the plurality of wirings respectively; and
- an insulating substrate which has a front surface and a rear surface separated from each other in a thickness direction and on the front surface of which a plurality of wiring portions are formed, wherein
- each of the plurality of control terminals extends in a direction in which the front surface faces with respect to the thickness direction.

The invention claimed is:

1. A semiconductor device comprising:
   - a plurality of first semiconductor elements, each of which has a first electrode, a second electrode, and a third electrode, and is subjected to an ON-OFF control between the first electrode and the second electrode in accordance with a first driving signal input to the third electrode;
   - a first control terminal to which the first driving signal is input;
   - a first wiring portion to which the first control terminal is connected;
   - at least one second wiring portion separated from the first wiring portion;
   - at least one first connection member to conduct the first wiring portion and the second wiring portion; and
   - at least one second connection member to conduct the second wiring portion and the third electrode of one of the plurality of first semiconductor elements, wherein
   - respective first electrodes of the plurality of first semiconductor elements are electrically connected to one another, and respective second electrodes of the plurality of first semiconductor elements are electrically connected to one another.

2. The semiconductor device according to claim 1, wherein
   - the at least one second wiring portion comprises a plurality of second wiring portions,
   - the at least one first connection member comprises a plurality of first connection members,
   - the at least one second connection member comprises a plurality of second connection members,
   - the plurality of second wiring portions are separated from one another,
   - the plurality of first connection members are connected to the first wiring portion, and are connected to the plurality of second wiring portions respectively, and
   - the plurality of second connection members are connected to the plurality of second wiring portions respectively, and are connected to the third electrode of each of the plurality of first electrodes respectively.

3. The semiconductor device according to claim 2, further comprising a first insulating substrate having a first front surface and a first rear surface separated from each other in a thickness direction,
   - wherein the first wiring portion is formed on the first front surface.

4. The semiconductor device according to claim 3, further comprising at least one second insulating substrate, each of which has a second front surface and a second rear surface separated from each other in the thickness direction, wherein
   - the second rear surface is opposed to the first front surface, and
   - at least one of the plurality of second wiring portion is formed on the second front surface.

5. The semiconductor device according to claim 4, wherein
the at least one second insulating substrate comprises a plurality of second insulating substrates; and
the plurality of second insulating substrates are respectively formed on the second front surface of each of the plurality of second insulating substrates.

6. The semiconductor device according to claim 5, wherein
the plurality of first semiconductor elements are disposed in line with a first direction orthogonal to the thickness direction,
the first wiring portion comprises a first band-like portion which extends in the first direction, and
the first band-like portion on one side with respect to a second direction orthogonal to both the thickness direction and the first direction when seen from the plurality of first semiconductor elements.

7. The semiconductor device according to claim 6, further comprising:
a first detection terminal for detecting a conduction state of the second electrode of each of the plurality of first semiconductor elements;
a third wiring portion to which the first detection terminal is connected;
a plurality of fourth wiring portions which are separated from one another and each of which is separated from the third wiring portion;
a plurality of third connection members which respectively conduct the plurality of fourth wiring portions to the third wiring portion; and
a plurality of fourth connection members which respectively conduct the plurality of fourth wiring portions to the second electrode of each of the plurality of first semiconductor elements.

8. The semiconductor device according to claim 7, wherein
the third wiring portion comprises a second band-like portion which extends in the first direction,
the first band-like portion and the second band-like portion have longitudinal directions which are parallel to each other, and
each of the plurality of the second insulating substrates is over both the first band-like portion and the second band-like portion.

9. The semiconductor device according to claim 6, further comprising:
a plurality of second semiconductor elements, each of which has a fourth electrode, a fifth electrode, and a sixth electrode, and is subjected to an ON-OFF control between the fourth electrode and the fifth electrode in accordance with a second driving signal input to the sixth electrode;
a second control terminal to which the second driving signal is input;
a fifth wiring portion to which the second control terminal is connected;
at least one sixth wiring portion separated from the fifth wiring portion;
at least one fifth connection member to conduct the fifth wiring portion and the sixth wiring portion; and
at least one sixth connection member to conduct the sixth wiring portion and the sixth electrode of one of the plurality of second semiconductor elements, wherein
the respective fourth electrodes of the plurality of second semiconductor elements are electrically connected to one another, and the fifth electrodes of the plurality of second semiconductor elements are electrically connected to one another, and
the respective second electrodes of the plurality of first semiconductor elements are electrically connected to the fourth electrodes of the plurality of second semiconductor elements respectively.

10. The semiconductor device according to claim 9, wherein
the at least one sixth wiring portion comprises a plurality of sixth wiring portions,
the at least one fifth connection member comprises a plurality of fifth connection members,
the at least one sixth connection member comprises a plurality of sixth connection members,
the plurality of sixth wiring portions are separated from one another,
the plurality of fifth connection members are connected to the fifth wiring portion, and are connected to the plurality of sixth wiring portions respectively, and
the plurality of sixth connection members are connected to the plurality of sixth wiring portions respectively, and are connected to the sixth electrode of each of the plurality of second electrodes respectively.

11. The semiconductor device according to claim 10, further comprising at least one third insulating substrate, each of which has a third front surface and a third rear surface separated from each other in the thickness direction, wherein
the third rear surface is opposed to the first front surface, and
at least one of the plurality of sixth wiring portions is formed on the third front surface.

12. The semiconductor device according to claim 11, wherein
the at least one third insulating substrate comprises a plurality of third insulating substrates,
the plurality of sixth wiring portions are formed on the third front surface of each of the plurality of third insulating substrate respectively.

13. The semiconductor device according to claim 12, wherein
the plurality of second semiconductor elements are disposed in line with the first direction, and are positioned on a side opposite with respect to the second direction to a side where the first band-like portion is positioned when seen from the plurality of first semiconductor elements,
the fifth wiring portion comprises a third band-like portion which extends in the first direction, and
the third band-like portion is positioned on one side with respect to the second direction when seen from the plurality of second semiconductor elements.

14. The semiconductor device according to claim 13, further comprising:
a second detection terminal for detecting a conduction state of the fifth electrode of each of the plurality of second semiconductor elements;
a seventh wiring portion to which the second detection terminal is connected;
a plurality of eighth wiring portions which are separated from one another and each of which is separated from the seventh wiring portion;
a plurality of seventh connection members which respectively conduct the plurality of eighth wiring portions to the seventh wiring portion; and a plurality of eighth connection members which respectively conduct the plurality of eighth wiring portions to the fifth electrode of each of the plurality of second semiconductor elements.

15. The semiconductor device according to claim 14, wherein
the seventh wiring portion comprises a fourth band-like portion which extends in the first direction,
the third band-like portion and the fourth band-like portion have longitudinal directions which are parallel to each other, and
each of the plurality of the third insulating substrates is over both the third band-like portion and the fourth band-like portion.

16. The semiconductor device according to claim 13, wherein
each of the plurality of first semiconductor elements has a first element front surface and a first element rear surface, and on each of the plurality of first semiconductor elements, the first electrode is formed on the first element rear surface, and the second electrode and the third electrode are formed on the first element front surface, and
each of the plurality of second semiconductor elements has a second element front surface and a second element rear surface, and on each of the plurality of second semiconductor elements, the fourth electrode is formed on the second element rear surface, and the fifth electrode and the sixth electrode are formed on the second element front surface.

17. The semiconductor device according to claim 16, further comprising;
a first mounting portion on which the plurality of first semiconductor elements are mounted; and
a second mounting portion on which the plurality of second semiconductor elements are mounted, wherein
the first mounting portion and the second mounting portion are respectively made of a conductive material, and are separated from each other,
the respective first electrodes of the plurality of first semiconductor elements are conducted to one another through the first mounting portion, and
the respective fourth electrodes of the plurality of second semiconductor elements are conducted to one another through the second mounting portion.

18. The semiconductor device according to claim 17, wherein
the first mounting portion and the second mounting portion are opposed to the first rear surface,
the first insulating substrate comprises a plurality of first opening portions and a plurality of second opening portions, each of which extends in the thickness direction from the first front surface to the first rear surface,
the plurality of first opening portions surround each of the plurality of first semiconductor elements when seen in the thickness direction, and
the plurality of second opening portions surround each of the plurality of second semiconductor elements when seen in the thickness direction.

19. The semiconductor device according to claim 9, further comprising:
a first power terminal portion conducted to the first electrode of each of the plurality of first semiconductor elements;
a second power terminal portion conducted to the fifth electrode of each of the plurality of second semiconductor elements; and
a third power terminal portion conducted to the second electrode of each of the plurality of first semiconductor elements and the fourth electrode of each of the plurality of second semiconductor elements, wherein
a direct current voltage is applied between the first power terminal portion and the second power terminal portion,
the direct current voltage is converted to an alternate current voltage by an ON-OFF control of the plurality of first semiconductor elements and the plurality of second semiconductor elements, and
the alternate current voltage is output from the third power terminal portion.

20. A semiconductor device comprising:
a plurality of semiconductor elements, each of which has a first electrode, a second electrode, and a third electrode, and is subjected to an ON-OFF control between the first electrode and the second electrode in accordance with a driving signal input to the third electrode;
a plurality of control terminals to each of which the driving signal is input;
a plurality of wiring portions which are conducted to the plurality of control terminals and to which the plurality of control terminals are bonded;
the plurality of connection members which connect the third electrode of each of the plurality of semiconductor elements and the plurality of wirings respectively; and
an insulating substrate which has a front surface and a rear surface separated from each other in a thickness direction and on the front surface of which a plurality of wiring portions are formed, wherein
each of the plurality of control terminals extends in a direction in which the front surface faces with respect to the thickness direction.

* * * * *